United States Patent
Alkan

(10) Patent No.: US 10,868,373 B2
(45) Date of Patent: *Dec. 15, 2020

(54) MINI ISOLATOR

(71) Applicant: PPC BROADBAND, INC., East Syracuse, NY (US)

(72) Inventor: Erdogan Alkan, Manlius, NY (US)

(73) Assignee: PPC BROADBAND, INC., East Syracuse, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/521,073

(22) Filed: Jul. 24, 2019

(65) Prior Publication Data
US 2019/0348775 A1    Nov. 14, 2019

Related U.S. Application Data

(63) Continuation of application No. 15/468,893, filed on Mar. 24, 2017, which is a continuation-in-part of
(Continued)

(51) Int. Cl.
*H01P 1/20* (2006.01)
*H01R 9/00* (2006.01)
(Continued)

(52) U.S. Cl.
CPC .............. *H01R 9/00* (2013.01); *H01P 1/202* (2013.01); *H01P 1/2007* (2013.01); *H01P 1/30* (2013.01); *H01P 3/06* (2013.01); *H03H 1/0007* (2013.01)

(58) Field of Classification Search
CPC . H03H 1/0007; H01P 1/36; H01P 1/20; H01P 1/2007; H01P 1/202; H01P 3/06
See application file for complete search history.

(56) References Cited

U.S. PATENT DOCUMENTS 4,267,529 A    5/1981   Brun
4,945,318 A    7/1990   Kabachinski
(Continued)

FOREIGN PATENT DOCUMENTS

WO    2017/062975 A1    4/2017

OTHER PUBLICATIONS

Shane Thomas (Authorized Officer), International Search Report and Written Opinion dated Aug. 2, 2017, PCT Application No. PCT/US2017/024049, pp. 1-16.
(Continued)

*Primary Examiner* — Stephen E. Jones
(74) *Attorney, Agent, or Firm* — MH2 Technology Law Group LLP

(57) ABSTRACT

An isolator includes an input connector configured to connect the isolator to a first device. The isolator also includes an output connector configured to connect the isolator to a second device. The isolator also includes a body including an outer shield. The isolator also includes a coupling member positioned at least partially within the outer shield. The coupling member is configured to electrically couple with the outer shield. The isolator also includes a coaxial circuit positioned at least partially around a first portion of the coupling member. The isolator also includes a toroid positioned at least partially around a second portion of the coupling member. The isolator also includes a compression material configured to apply a force to the coaxial circuit and the toroid. The isolator also includes a signal conditioning circuit configured to condition signals communicated between the input connector and the output connector.

38 Claims, 15 Drawing Sheets

Related U.S. Application Data application No. 15/290,216, filed on Oct. 11, 2016, now Pat. No. 10,381,702.

(60) Provisional application No. 62/312,891, filed on Mar. 24, 2016, provisional application No. 62/239,685, filed on Oct. 9, 2015.

(51) Int. Cl.
  *H03H 1/00* (2006.01)
  *H01P 1/30* (2006.01)
  *H01P 1/202* (2006.01)
  *H01P 3/06* (2006.01)

(56) References Cited

U.S. PATENT DOCUMENTS

| | | | |
|---|---|---|---|
| 6,152,743 | A | 11/2000 | Fox |
| 7,094,104 | B1 | 8/2006 | Burke et al. |
| 7,749,026 | B1 | 7/2010 | Li et al. |
| 8,149,070 | B2 | 4/2012 | Albag et al. |
| 8,734,025 | B2 | 5/2014 | Snyder et al. |
| 8,758,059 | B2 | 6/2014 | Watanabe et al. |
| 8,975,520 | B2 | 3/2015 | Blake et al. |
| 9,028,276 | B2 | 5/2015 | Wilson et al. |
| 9,112,323 | B2 | 8/2015 | Goebel et al. |
| 9,178,317 | B2 | 11/2015 | Holland |
| 9,246,275 | B2 | 1/2016 | Holland et al. |
| 9,444,197 | B2 | 9/2016 | Goebel et al. |
| 9,647,394 | B2 | 5/2017 | Goebel et al. |
| 10,381,702 | B2 * | 8/2019 | Alkan ............... H01P 1/30 |
| 10,530,072 | B2 * | 1/2020 | Alkan ............... H01R 9/00 |
| 2003/0160684 | A1 | 8/2003 | Cern |
| 2011/0248801 | A1 | 10/2011 | Blake et al. |
| 2012/0122329 | A1 | 5/2012 | Montena |
| 2012/0196476 | A1 | 8/2012 | Haberek et al. |
| 2012/0202378 | A1 | 8/2012 | Krenceski et al. |
| 2013/0065433 | A1 | 3/2013 | Burris |
| 2013/0115812 | A1 | 5/2013 | Ehret et al. |
| 2014/0322972 | A1 | 10/2014 | Krenceski et al. |

OTHER PUBLICATIONS

Blaine R. Copenheaver (Authorized Officer), International Search Report and Written Opinion dated Dec. 19, 2016, PCT Application No. PCT/US2016/056365, pp. 1-12.

María José Lamus Becerra, Office Action dated Jul. 25, 2019, Columbia Patent Application No. NC2018/0003727, pp. 1-32 (including English translation).

Examination Report dated Aug. 9, 2019, Chilean Patent Application No. 00864-2018, pp. 1-11 (including English translation).

María José Lamus Becerra, Office Action dated Jul. 29, 2019, Columbia Patent Application No. NC2018/0010062, pp. 1-19 (including English translation).

Notice of Allowance dated Aug. 28, 2019, U.S. Appl. No. 15/468,893, pp. 1-16.

Paul D. Chancellor, ESQ., Letter Re Prior Art to PPC Broadband, Inc. dated Aug. 5, 2019, Ocean Law, pp. 1-2.

Orozco et al., Office Action dated Apr. 29, 2020, CO Application No. NC2018/0010062, 17 pages (including translation).

* cited by examiner

MINI ISOLATOR

CROSS-REFERENCES TO RELATED APPLICATIONS

This application is a continuation of U.S. patent application Ser. No. 15/468,893, filed Mar. 24, 2017, which claims the benefit and priority of U.S. Provisional Patent Application No. 62/312,891, filed Mar. 24, 2016. U.S. patent application Ser. No. 15/468,893 is also a continuation-in-part of U.S. patent application Ser. No. 15/290,216, filed Oct. 11, 2016, which claims benefit and priority of U.S. Provisional Patent Application No. 62/239,685, filed Oct. 9, 2015. The entire contents of each of these documents is incorporated herein by reference.

BACKGROUND

In a typical building, ground potential in the electrical systems of the building needs to be equalized for all networks so that different networks function properly. For example, a power line and cable television (CATV) network require equal ground potentials as they utilize common equipment. For developed countries, the ground installation and setup may be regulated, and thus the networks in a building may not experience issues. On the other hand, other jurisdictions where regulation is less, improper grounding may become an issue when different networks have different ground potentials.

When two networks are connected, for example, when a cable is connected to the CATV set top box, a current will flow from CATV network to a neutral line of the set top box or vice versa if the ground potentials are not equal. In some cases, this current may reach levels that damage the set top box, and may even become hazardous to the user or installer. Therefore, the neutral lines of these networks need to be isolated to prevent current flow.

Currently, there are isolators available to address this problem. However, the available isolators are bulky and expensive. For example, in some isolators, isolation is achieved on a printed circuit board that has two ground metallization: one side of the metalization connected to a female connector side and the other side of the metalization to a male connector. The coupling between two ground metalizations is achieved via a coupling capacitor and electromagnetic interference (EMI) filtering is achieved on the printed circuit board from one side metalization to the other using ferrites. This configuration results in large and bulky isolators.

SUMMARY

Embodiments in accordance with the present disclosure provide a coaxial radio frequency (RF) isolator. The isolator includes a conductive body including a first coaxial coupler configured to connect the isolator to a first device. The isolator also includes a conductive outer shield positioned at least partially around at least a portion of the conductive body. The isolator also includes a dielectric barrier positioned at least partially between conductive body and the conductive outer shield. The dielectric barrier is configured to electrically isolate the conductive body from the conductive outer shield. The isolator also includes a second coaxial coupler configured to connect the isolator to a second device. The isolator also includes a signal conditioning device configured to condition RF signals communicated between the first coaxial coupler and the second coaxial coupler. The isolator also includes a signal path extending at least partially through the first coaxial coupler, the signal conditioning device, and the second coaxial coupler. The signal path is configured to conduct the RF signals between the first coaxial coupler and the second coaxial coupler. The isolator also includes a coaxial circuit configured to block direct current flow between the conductive body, the conductive outer shield, the second coaxial coupler, or a combination thereof. The isolator also includes a magnetic toroid configured to filter the RF signals from electromagnetic interference.

In another embodiment, the isolator includes an input connector configured to connect the isolator to a first device. The isolator also includes an output connector configured to connect the isolator to a second device. The isolator also includes a body including an outer shield. The isolator also includes a coupling member positioned at least partially within the outer shield. The coupling member is configured to electrically couple with the outer shield. The isolator also includes a coaxial circuit positioned at least partially around a first portion of the coupling member. The isolator also includes a toroid positioned at least partially around a second portion of the coupling member The isolator also includes a compression material configured to apply a force to the coaxial circuit and the toroid. The isolator also includes a signal conditioning circuit configured to condition signals communicated between the input connector and the output connector.

In yet another embodiment, the isolator includes an outer shield. The isolator also includes a first connector configured to connect the isolator to a first device. The isolator also includes a second connector configured to connect the isolator to a second device. The isolator also includes a conditioning circuit configured to condition signals communicated between the first connector and the second connector. The isolator also includes a coaxial circuit configured to provide ground isolation between the first connector and the second connector. The isolator also includes a compression material configured to apply a force to the coaxial circuit.

BRIEF DESCRIPTION OF THE DRAWINGS

Various features of the implementations can be more fully appreciated, as the same become better understood with reference to the following detailed description of the implementations when considered in connection with the accompanying figures, in which.

DETAILED DESCRIPTION

In the following detailed description, references are made to the accompanying figures, which illustrate specific examples of various implementations. Electrical, mechanical, logical, and structural changes can be made to the examples of the various implementations without departing from the spirit and scope of the present teachings. The following detailed description is, therefore, not to be taken in a limiting sense and the scope of the present teachings is defined by the appended claims and their equivalents.

An isolator in accordance with aspects of the present disclosure provides EMI filtering, ground coupling, and/or surge protection, which can protect a PCB housed within the isolator. In some implementations, the PCB can be a coaxial PCB, which can be connected within the isolator during assembly solely by compression fitting (e.g., without additional attachments, such as solder or adhesive). Additionally, because the PCB includes a coaxial design, space utilized by the coaxial PCB in the isolator is reduced. Further, in some implementations of the isolator, the coaxial PCB can provide ground connections between two isolated cavities. Moreover, in some implementations, the isolator includes an RF filtering cavity surrounding the coaxial PCB and one or more toroids to filter RF signals to reduce EMI.

According to additional aspects of the present disclosure, the isolator can include an insulating grip formed on an exterior of the isolator. The insulating grip can be formed of an insulating sleeve that surrounds an exterior portion of the isolator. The insulating grip can provide electrical shock protection for a user, for example, an installer, handling the isolator. The insulating grip can also provide protection against shorting two insulated sides of the isolators for additional safety to hardware coupled to the isolator. Additionally, the insulating grip can include raised members that provide friction and improve handling and installation. Further, the insulating grip can provide improved aesthetic design for the isolator by providing colors and patterns to an exterior of the isolator.

Figure 1A:
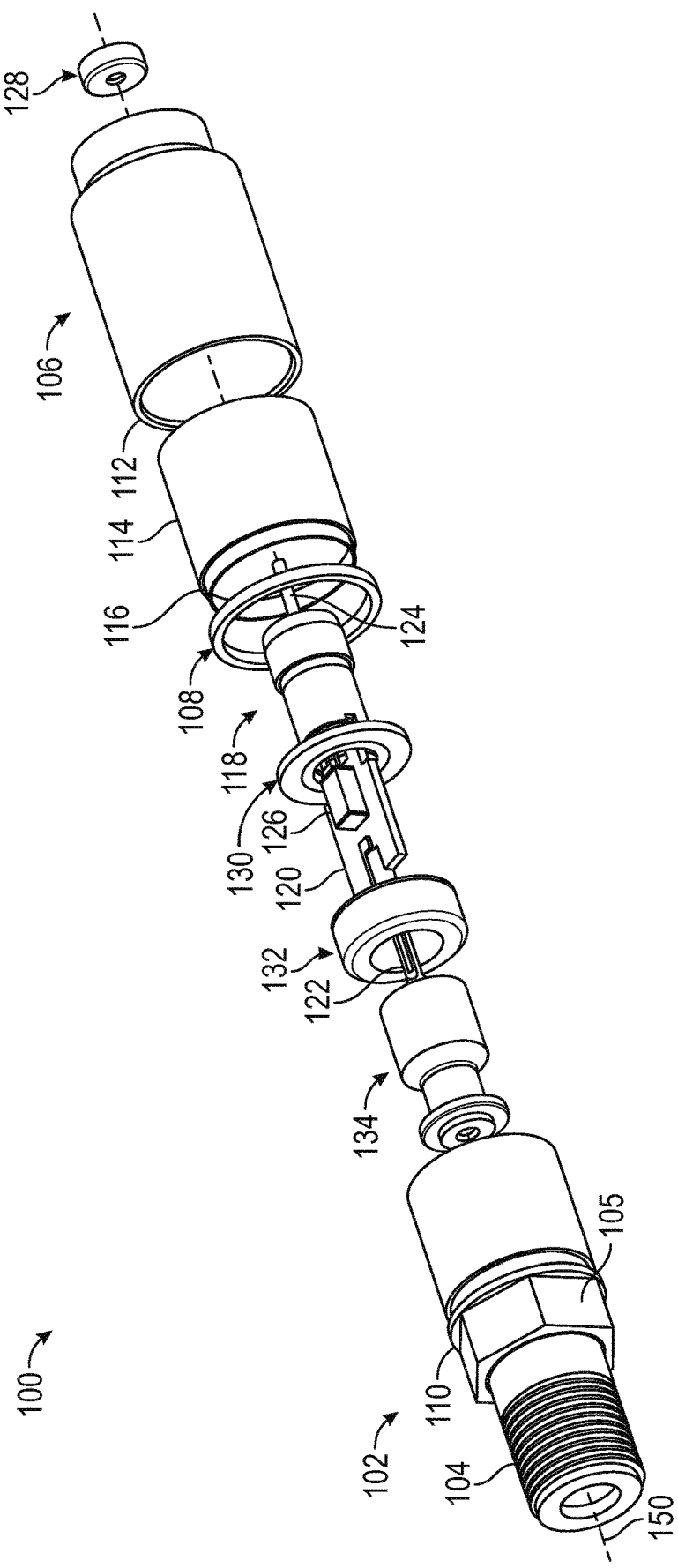
FIG. 1A illustrates an exploded perspective view of example of an isolator, according to various implementations consistent with the present disclosure.
Figure 1B:
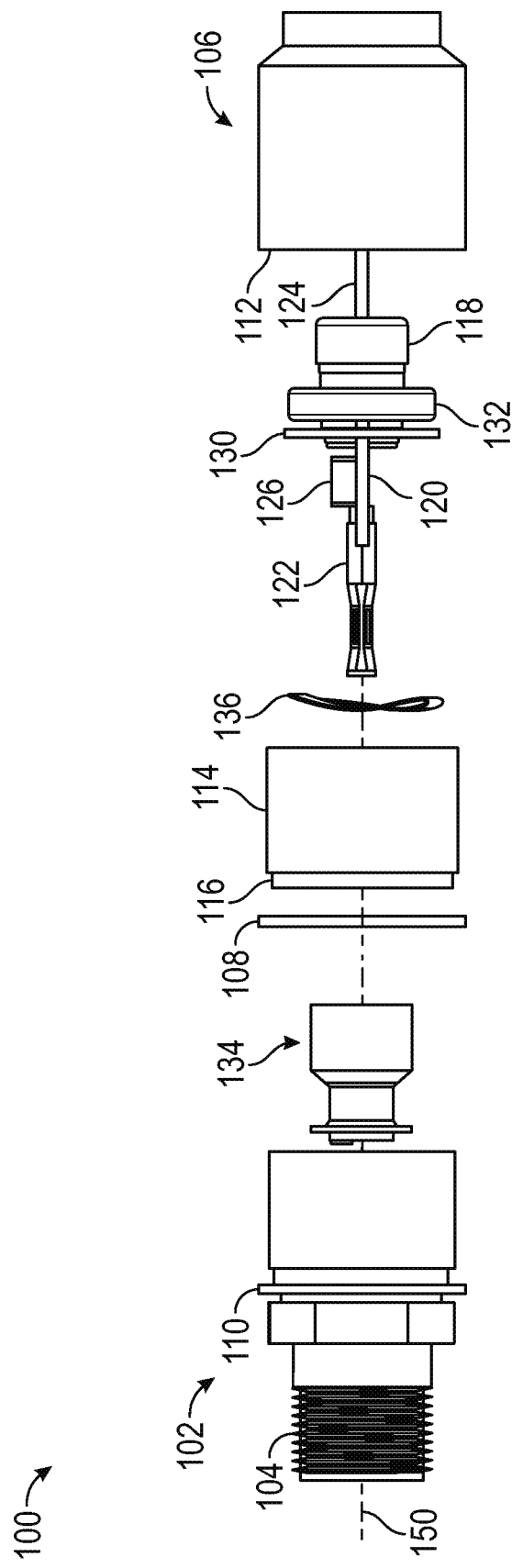
FIG. 1B illustrates an exploded side view of an example of an isolator, according to various implementations consistent with the present disclosure.
Figure 1C:
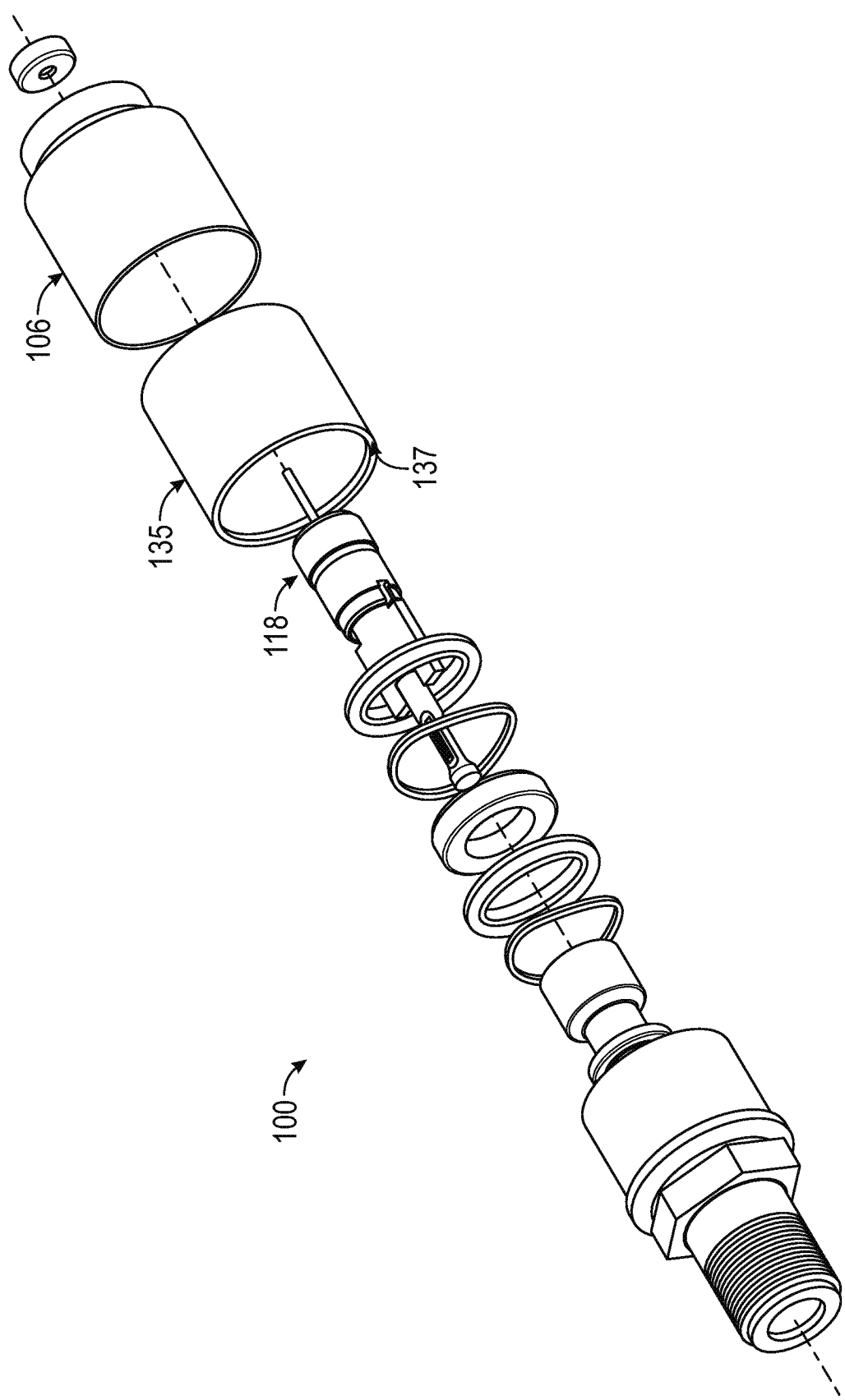
FIG. 1C illustrates an exploded perspective view of an example of an isolator, according to various implementations consistent with the present disclosure.
Figure 1D:
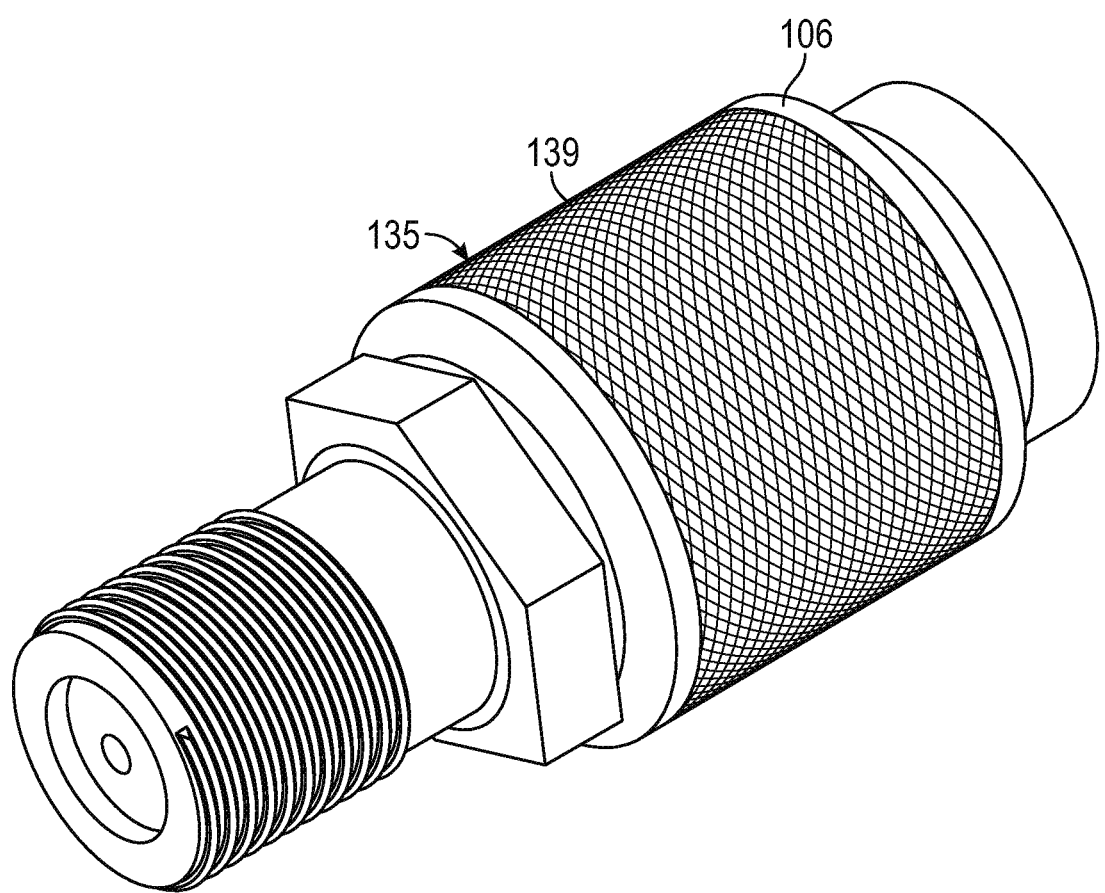
FIG. 1D illustrates a perspective view of an example of an isolator, according to various implementations consistent with the present disclosure.
Figure 1E:
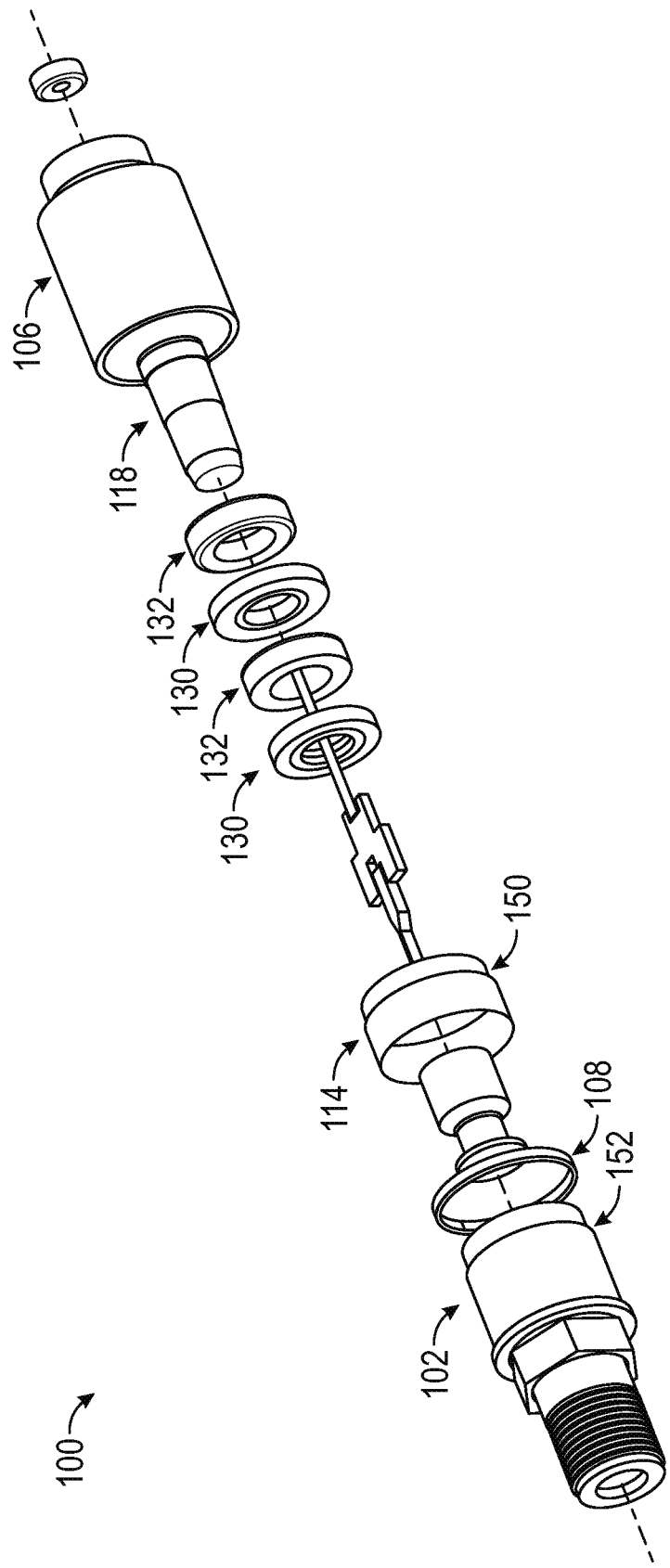
FIG. 1E illustrates an exploded perspective view of an example of an isolator, according to various implementations consistent with the present disclosure.

FIGS. 1A-1E illustrate examples of an isolator 100, according to various implementations. FIG. 1A illustrates an exploded, three-dimensional view of the isolator 100, and FIG. 1B illustrates a two-dimensional, cross-sectional view of the isolator 100. FIG. 1C illustrates an exploded, three-dimensional view of the isolator 100 with an insulating grip. FIG. 1D illustrates a three-dimensional view of the isolator 100 with the insulating grip. FIG. 1E illustrates a three-dimensional view of the isolator 100 with a two stage design. While FIGS. 1A-1E illustrate various components contained in the isolator 100, FIGS. 1A-1E illustrate one example of an isolator and additional components can be added and existing components can be removed.

As shown in FIGS. 1A and 1B, the isolator 100 can include a body 102 that includes a coupler 104, a threaded nut 105, and an outer shield 106 arranged along a central axis 150. In some implementations, the isolator 100 can be a coaxial radio frequency (RF) isolator, in which the body 102, the coupler 104, the threaded nut 105, and the outer shield 106 are positioned coaxially around a common central axis 150 of the isolator. The coupler 104 can be a female (or male) connector that includes one or more threads that can connect to a male (or female) coaxial connector of, for example, a RG-6 coaxial cable. The threaded nut 105 can be screwed onto the threads of the connector. The outer shield 106 can be configured to slide over a portion of the body 102 up to a lip 110. In some implementations, the body 102 and the outer shield 106 form an internal cavity for the components within the isolator 100. In some implementations, the outer shield 106 can be compression fitted over the body 102 such that the two can be securely attached without the use of, for example, an adhesive material or solder. The body 102 and the outer shield 106 can be formed of a conductor material, for example, a metal or metal alloy. In some implementations, the isolator 100 can also include a spacer 108. The spacer 108 can be formed with an annular shape (e.g., a cylindrical ring) to be placed over a portion of the body 102. The spacer 108 can be formed a dielectric material, such as a plastic insulator. When the outer shield 106 is compression-fitted over the body 102, the spacer 108 can fit between the lip 110 of the body 102 and an inner lip 112 of the outer shield 106.

In some implementations, the isolator 100 can include a sleeve 114 that can include a peripheral lip 116. The peripheral lip 116 can be formed such that an outer diameter of the sleeve 114 at the peripheral lip 116 is smaller than an outer diameter the remaining portion of the sleeve 114, while the inner diameter of the sleeve 114 is substantially the same over the length of the sleeve 114. The peripheral lip 116 can be configured to receive the spacer 108. The sleeve 114 can be formed of a dielectric material, for example, a plastic insulator. The sleeve 114 can be placed between the outer shield 106 and the body 102. In embodiments, the outer diameter of the peripheral lip 116 can be substantially the same as an inner diameter of the spacer 108. The spacer 108 and the sleeve can create an electrically-insulating barrier between the body 102 and the outer shield 106 that electrically isolates the body 102 from the outer shield 106 when the shield is compression fitted on the body 102.

In some implementations, the isolator 100 can include a coupling/filtering member 118. The coupling/filtering member 118 can be pressed inside the outer shield 106 to form a smaller internal cavity that is used for the components of the isolator 100, as further described below with reference to FIGS. 2A and 2B. The coupling/filtering member 118 can be formed of a conductive material, for example, a metal or metal alloy.

Figure 2A:
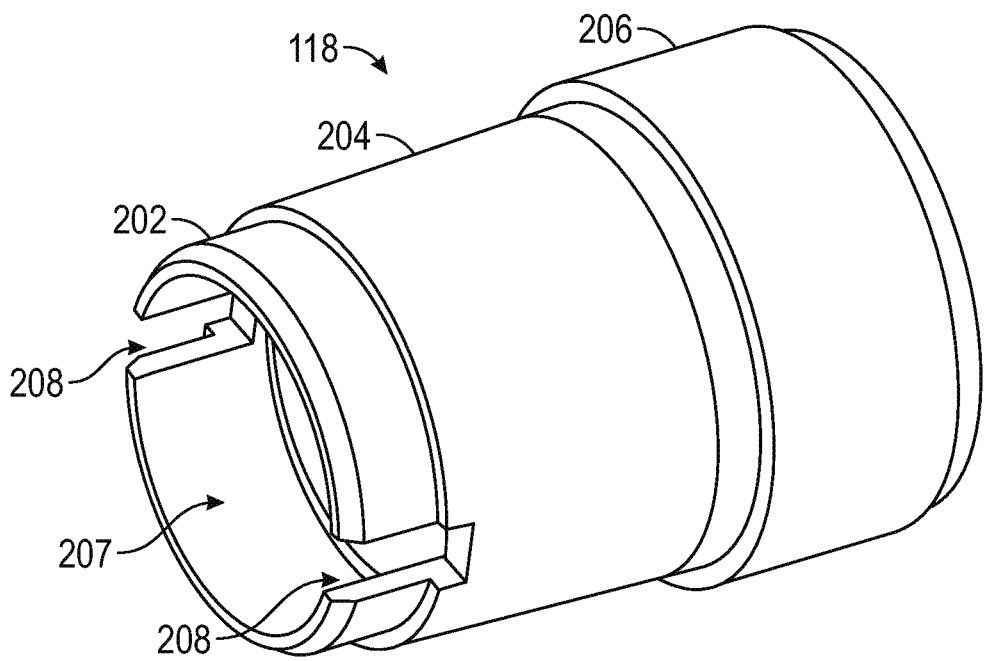
FIG. 2A illustrates a perspective view of an example of a filtering and coupling element, according to various implementations consistent with the present disclosure.

FIG. 2A illustrates an example of the filtering/coupling member 118, according to various implementations. As shown, filtering/coupling member 118 can be formed in a generally-cylindrical shape with increasing outer diameters 202, 204, and 206. The coupling/filtering member 118 can be hollow, forming a cavity 207 therein. The coupling/filtering member 118 can also include slots 208 proximal to an axial end thereof. The slots 208 may be configured to receive and hold a PCB assembly (e.g., PCB 120) stable, for example, to prevent such PCB assembly from rotating freely in the cavity 207 with respect to the filter/coupling member 118, or to be used as a ground contact for the PCB assembly.

Figure 2B:
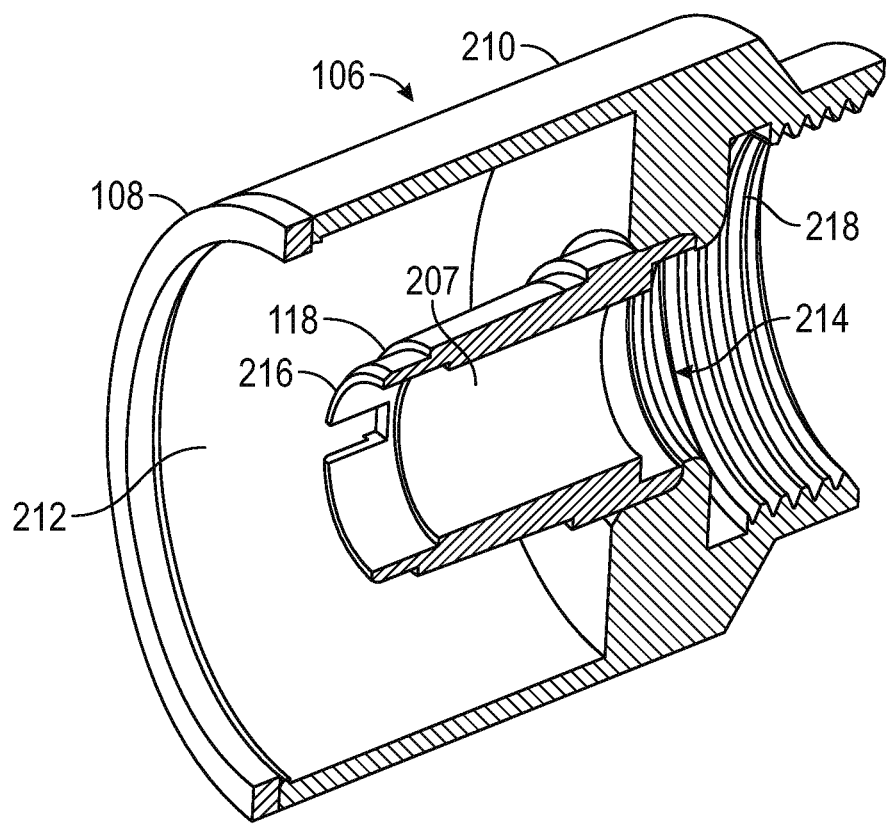
FIG. 2B illustrates a cutaway perspective view of an example of a filtering and coupling element, according to various implementations consistent with the present disclosure.

With continuing reference to FIG. 2A, FIG. 2B illustrates the filtering/coupling member 118 received into the outer shield 106. As shown, the outer shield 106 can be at least partially formed as a cylindrical member 210 including a first opening 212 and a second opening 214. The first and second openings 212, 214 can be axially oriented and separated apart. In an embodiment, the first opening 212 can define a larger diameter than the second opening 214. The second opening 214 can be configured to receive the filtering/coupling member 118. Accordingly, the filtering/coupling member 118 can, in some embodiments, be received into the outer shield 106 through the first opening 212 and seated into the second opening 214. When the filtering/coupling member 118 is received into the second opening 214, an annular cavity 216 can be defined between (e.g., by) the outer shield 106 and the coupling/filtering member 118. The cylindrical member 210 can also include one or more (e.g., internal) threads 218 to connect to the isolator 100 to a cable or device connected to the output of the isolator 100. The threads 218 of the coupling/filtering member 118 can provide a male (or female) connector that can connect to a female (or male) coaxial connector of, for example, a RG-6 coaxial cable. In some implementations, the filtering/coupling member 118 can be designed as a part of the outer shield 106 to reduce the assembly part count. In this implementation, the coupling/filtering member 118 and the outer body 106 can be a single part or structure.

Returning to FIGS. 1A and 1B, the isolator 100 can include a PCB 120. The PCB 120 can be coupled between a PCB coupler 122 and an output pin 124. The PCB coupler 122 can be configured to receive a male pin from a device or cable connected to the coupler 104. The output pin 124 can be configured to conduct signals to/from devices or cables connected to the isolator 100. The isolator 100 can include a support and sealing member 128 at or proximal to an axial end of the outer shield 106. The support and sealing member 128 can be formed in a cylindrical shape with a hole to receive the output pin 124. The support and sealing member 128 can be configured to hold the output pin 124 in place for connection of devices or cables to the isolation device 100.

The PCB 120 can be configured to condition signals passing from the PCB coupler 122 to the output pin 124. The PCB 120 can include any type of circuitry 126 to provide filtering and conditioning to the signals passing from the PCB coupler 122 to the output pin 124. For example, the PCB 120 can include one or more low-pass filters, bandpass filters, band reject filters, high-pass filters, amplifiers, diplexers, Multimedia over Coax Alliance (MoCA) filters, and the like. The PCB 120, the PCB coupler 122, and the output pin 124 include an RF signal transmission path through the coupling/filtering member 118 that conductively couples devices and/or cables connected at the input (e.g., coupler 104) and the output (e.g., threads 218) of the isolator 100. In some implementations, the PCB 120 (including the circuitry 126), the PCB coupler 122, and the output pin 124 can be combined into a single assembly.

In some implementations, the isolator 100 includes a coaxial PCB 130. The coaxial PCB 130 can be configured to provide a connection between the body 102 and the filtering/coupling member 118 and the outer shield 106. While coaxial PCB 130 is illustrated as having cylindrical (e.g., annular) shape, the coaxial PCB 130 can be formed using other profiles (e.g., rectangular, triangular, oval, etc.).

Figure 3A:
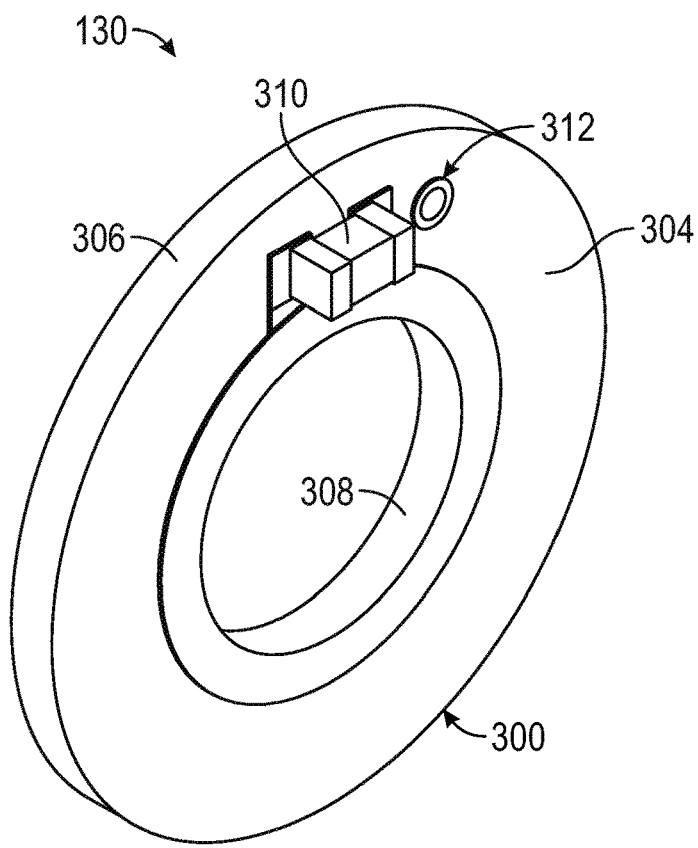
FIG. 3A illustrates a perspective view of an example of a coaxial printed circuit board (PCB), according to various implementations consistent with the present disclosure.
Figure 3B:
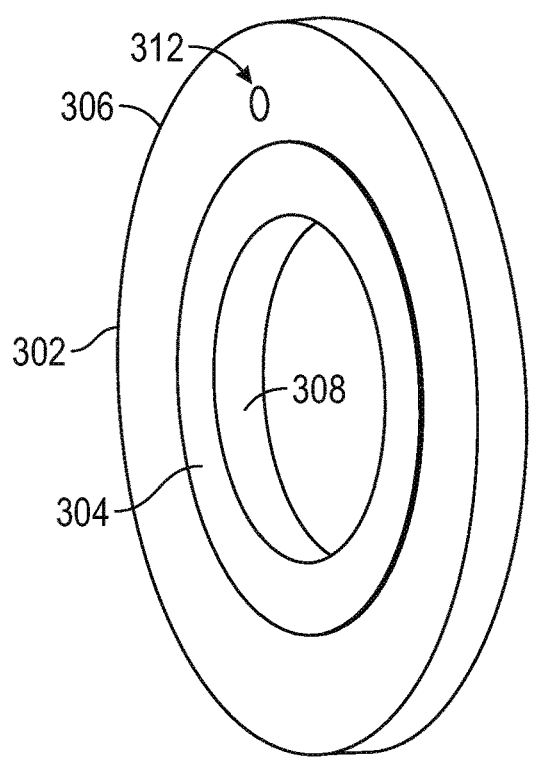
FIG. 3B illustrates a perspective view of an example of a coaxial printed circuit board (PCB), according to various implementations consistent with the present disclosure.

FIGS. 3A-3E illustrate different views of examples of the coaxial PCB 130, according to various implementations. In particular, FIG. 3A illustrates a perspective view of a front 300 of the coaxial PCB 130, and FIG. 3B illustrates a perspective view of a rear 302 of the coaxial PCB 130. As illustrated, the coaxial PCB 130 can include an isolator ring 304 positioned between an outer conductor layer 306 and inner conductor layer 308. The isolator ring 304 can be formed of a dielectric material, for example, a plastic insulator. The isolator ring 304 can be formed from a substrate material, for example, FR4 substrate. The outer conductor layer 306 and the inner conductor layer 308 can be formed of a conductive material, for example, a metal or metal alloy. The outer conductor layer 306 can be positioned at or proximal to an outer diameter of the PCB 130, and the inner conductor layer 308 may be positioned at or proximal to an inner diameter thereof.

The coaxial PCB 130 can include one or more surface mounted circuits 310 (e.g., a surface mounted technology (SMT) circuit) placed on the isolator ring 304 and a plated via a hole 312 formed axially in (e.g., through) the isolator ring 304. The hole 312 can be formed at least partially from conductive material, for example, a metal or metal alloy. In some implementations, for example, the one or more surface mounted circuits 310 can include capacitive circuits, inductive circuits, resistive circuits, filtering circuits, and the like. The outer conductor layer 306 and the inner conductor layer 308 can be electrically coupled through the one or more surface mounted circuits 310.

Figure 3C:
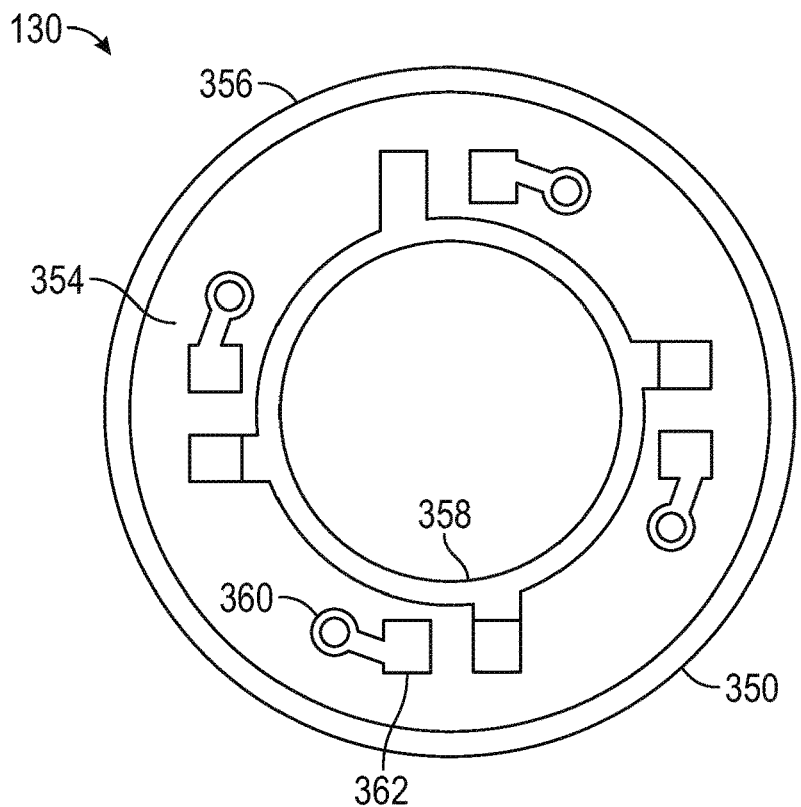
FIG. 3C illustrates a front view of an example of a coaxial PCB, according to various implementations consistent with the present disclosure.
Figure 3D:
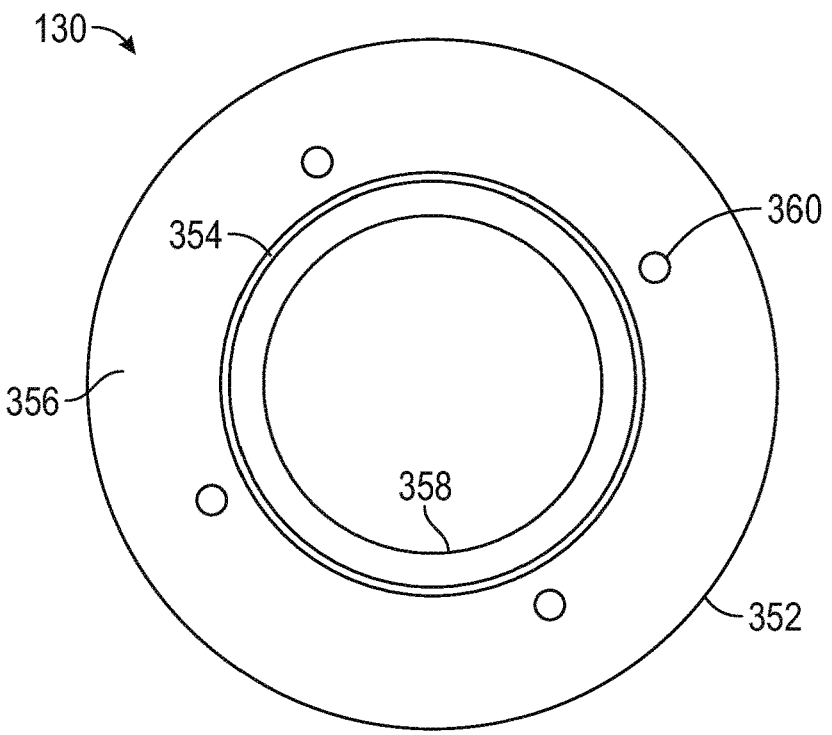
FIG. 3D illustrates a rear view of an example of a coaxial PCB, according to various implementations consistent with the present disclosure.

FIGS. 3C and 3D illustrate examples of another example of coaxial PCB 130, according to various implementations. In particular, FIG. 3C illustrates a view of a front 350 of the coaxial PCB 130, and FIG. 3D illustrates a view of a rear 352 of the coaxial PCB 130. The coaxial PCB 130 can include an isolator ring 354 positioned between two layers: an outer conductor layer 356 and an inner conductor layer 358. The top layer 356 can include one or more surface mounted circuit footprints 362 (e.g., four footprints), which can receive one or more surface mounted circuits. The isolator ring 354 can be formed of a dielectric material, for example, a plastic insulator. The isolator ring 354 can be formed from a substrate material, for example, FR4 substrate. The outer conductor layer 356 and the inner conductor layer 358 can be formed of a conductor material, for example, a metal or metal alloy.

The coaxial PCB 130 illustrated in FIGS. 3C and 3D can include one or more surface mounted circuits (not shown) placed on the isolator ring 354 and one or more plated via holes 360 formed in the isolator ring 304 and electrically coupled to the circuit footprints 362. The plated via holes 360 can be formed of a conductor material, for example, a metal or metal alloy. The outer conductor layer 356 and the inner conductor layer 358 can be electrically coupled through the one or more surface mounted circuits.

In some implementations, the coaxial PCB 130 can function to block direct current (DC) current flow between the body 102, and the outer shield 106 and coupling/filtering member 118. For example, the coaxial PCB 130 can be placed in the isolator 100 so that the outer ring conductor 306 (or the outer ring conductor 356) is in electrical contact with the body 102, and the inner ring conductor 308 (or inner ring conductor 358) is in electrical contact with the coupling/filtering member 118. For example, the inner diameter of the coaxial PCB 130 can be configured to fit over any of the diameters 202, 204, and 206 of the coupling/filtering member 118 depending on the configuration of the isolator 100, as further discussed below in FIGS. 4A-4D.

Figure 3E:
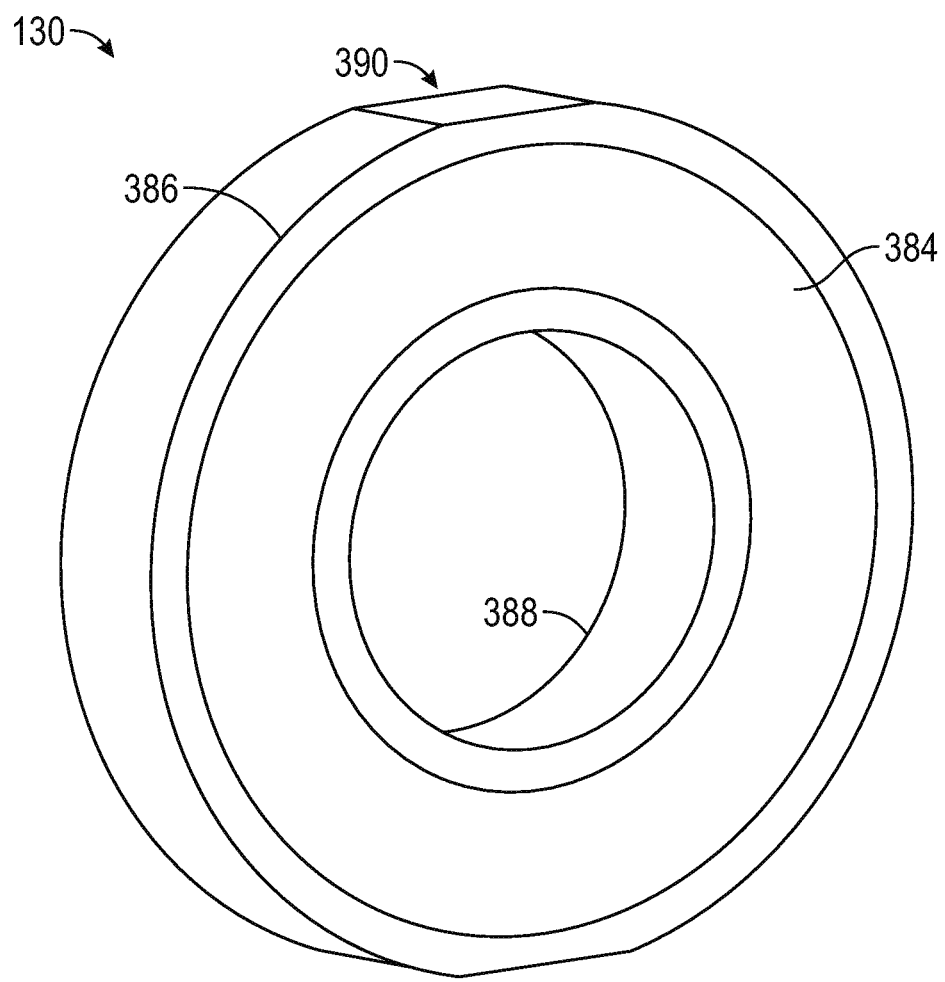
FIG. 3E illustrates a perspective view of an example of a coaxial PCB, according to various implementations consistent with the present disclosure.

FIG. 3E illustrates an implementation of the coaxial PCB 130. As illustrated in FIG. 3E, the coaxial PCB 130 can include an isolator ring 384 positioned between an outer ring conductor 386 and inner ring conductor 388. The isolator ring 384 can be formed from a dielectric material, (e.g., a substrate material, such as a FR4 substrate). The outer ring conductor 386 and the inner ring conductor 388 can be formed of a conductive material, for example, a metal or metal alloy, plated copper, copper etc. In some implementations, one or more areas 390 of the outer ring conductor 386 can be removed to accommodate support edges (not shown) for high volume PCB manufacturing.

Returning again to FIGS. 1A and 1B, in some implementations the coaxial PCB 130 illustrated in FIGS. 3C and 3D can function as a filter that blocks direct current ("DC") flow between the body 102, and the outer shield 106 and coupling/filtering member 118 by deploying capacitive coupling elements such as capacitors. For example, the coaxial PCB 130 can be placed in the isolator 100 so that the outer conductor layer 306 (or the outer conductor layer 356) is in electrical contact with the body 102 and the inner conductor layer 308 (or inner conductor layer 358) is in electrical contact with the coupling/filtering member 118. For example, the inner diameter of the coaxial PCB 130 can be configured to fit over any of the diameters 202, 204, and 206 of the coupling/filtering member 118 depending on the configuration of the isolator 100, as further discussed below in reference to FIGS. 4A-4D.

Still referring to FIGS. 1A and 1B, the isolator 100 can include one or more toroids 132 configured to filter and/or attenuate RF signal ingress into the isolator 100 or RF signal egress from the isolator 100 that may be induced by signals traveling through the isolator 100. The toroids 132 can be formed of a magnetic material (e.g., ferrite) having for example, a cylindrical shape. In accordance with aspects of the present disclosure, the one or more toroids 132 can be positioned axially adjacent to the coaxial PCB 130 and surrounding a portion of the coupling/filtering member 118 within the RF filtering cavity (e.g., inner cavity 216). In some implementations, the inner diameter of the toroid 132 can be formed to any of the diameters 202, 204, 206 of the coupling/filtering member 118. The toroid 132 can be configured to filter and/or attenuate RF ingress into the isolator or RF egress from the isolator 100 that may be induced by signals traveling through the isolator 100.

In some implementations, the isolator 100 includes a support member 134 configured to hold the PCB coupler 122 in place for connection of devices or cables to the input of the isolation device 100 at the coupler 104. The support member 134 can be formed in a cylindrical shape with a hole to receive the PCB coupler 122 and sized to fit within a diameter of the coupler 104.

Further, implementations of the isolator 100 can include a compression member 136 configured to provide axially-directed force on the components of the isolator 100 to improve the mechanical connections of the components. For example, the compression member 136 can be configured to provide force on the coaxial PCB 130 and/or the toroid 132. In some implementations, for example, the compression member 136 can be a spring or any other resilient member.

FIGS. 1C and 1D illustrate an example isolator 100 including an insulating grip 135, according to aspects of the present disclosure. The isolator 100 of FIGS. 1C and 1D can be the same or similar to that previously described. In some implementations, the isolator 100 can include an insulator sleeve 135. The insulator sleeve 135 can be formed in a cylindrical shape to fit over (e.g., slide over) a portion of the outer shield 106. The insulator sleeve 135 can be formed of a dielectric material, such as, plastic or rubber. The insulator sleeve 135 can provide an insulating barrier and/or grip on the outside of the isolator 100 so that the isolator 100 can be safely handled by an installer or user.

The insulator sleeve 135 can include a lip 137 formed on one end of the insulator sleeve 135. When the shield 106 is compression fitted over the body 102, the lip 137 of the insulator sleeve 135 can fit between the lip 110 of the body 102 and the edge 112 of the outer shield 106. In some implementations, the lip 137 of the insulator sleeve 135 can serve as the spacer 108, as described above. While not illustrated, the example of the isolator 100 illustrated in FIG. 1C can include a sleeve 114, as described below.

As illustrated in FIG. 1D, the insulator sleeve 135 can include one or more raised members 139. The one or more raised member 139 can provide a surface to increase the friction of the insulator sleeve 135. The increase in friction can improve the grip of the isolator 100 when handling the isolator 100. The one or more raised members 139 can be formed of any insulating material, such as plastic. The one or more raised members 139 can be formed in any size, shape, configuration, and number to provide a surface on the insulator sleeve 135 to improve the grip of the insulator sleeve 135. In some implementation, the insulator sleeve 135 can be formed in a particular color to identify the insulator sleeve as the gripping point on the isolator 100 and improve the esthetic design of the insulator sleeve. The insulator sleeve 135 can be formed in any color, for example, red as illustrated in FIG. 1D.

FIG. 1E illustrates example of the isolator 100 with a two stage design, according to aspects of the present disclosure. As shown in FIG. 1E, the isolator 100 can include one or more components as described above with reference to FIGS. 1A-1D. The various components of the isolator 100 shown in FIG. 1E can be the same or similar to those described previously herein with regard to FIGS. 1A-1D, 2A, 2B, and 3A-3E. The implementation of the isolator 100 shown in FIG. 1E can include two coaxial PCBs 130. The coaxial PCBs 130 can be configured to provide RF coupling between the body 102 and the filtering/coupling member 118 and the outer shield 106. The isolator 100 can include two toroids 132. As illustrated in FIG. 1E, the two coaxial PCBs 130 and toroids 132 can be positioned in an alternating pattern. The toroids 132 can be formed of a magnetic material, for example, ferrite. The toroids 132 can be positioned to surround a portion of the coupling/filtering member 118 in a cavity (e.g., annular cavity 216) of the filtering/coupling member 118. For example, the inner diameter of the toroids 132 can be formed to any of the diameters 202, 204, 206 of the coupling/filtering member 118. The toroids 132 can be configured to filter and/or attenuate RF ingress into the isolator or RF egress from the isolator 100 that may be induced by signals traveling through the isolator 100 gap.

In some implementations, as illustrated in FIG. 1E, the isolator 100 can include a sleeve 114. The sleeve 114 can be formed of a dielectric material and can be placed between the outer shield 106 and the body 102. The spacer 108 and/or the sleeve 114 can create a barrier between the body 102 and the outer shield 106 to electrically isolate the body 102 for the outer shield 106 when the shield is compression fitted on the body 102. In some implementations, the sleeve 114 can include a tapered portion 150 formed to a diameter smaller than the remaining portion of the sleeve 114. The tapered portion 150 can be configured to be engage with a tapered portion 152 of the body 102 when the isolator 100 is compression fitted.

FIGS. 4A-4I illustrate examples of configurations of an isolator 100, according to various implementations. Some of the components of FIGS. 4A-4I are not discussed below, but are described above with reference to FIGS. 1A-1E, 2A, 2B, and 3A-3E. While FIGS. 4A-4I illustrate some examples of configurations of an isolator 100, any of the configurations and components illustrated in FIGS. 4A-4I can be combined to form additional examples of configurations of an isolator 100.

Figure 4A:
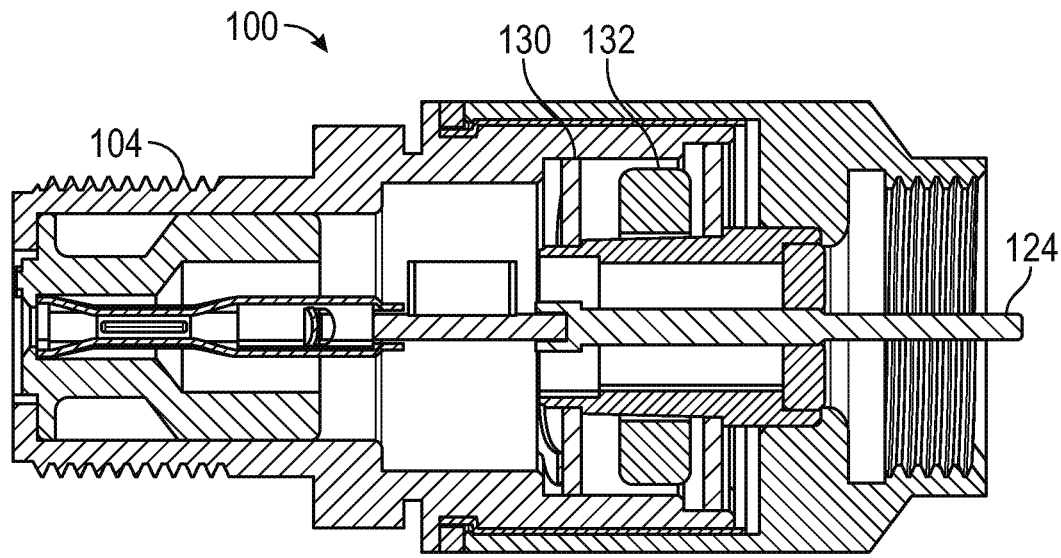
FIG. 4A illustrates a cutaway side view of an example of an isolator, according to various implementations consistent with the present disclosure.

FIG. 4A illustrates a cutaway side view of an example of the isolator 100, according to various implementations. As shown, the toroid 132 can be positioned on a side of the isolator 100 closer to the coupler 104. In some implementations, for example, the coaxial PCB 130 can be the coaxial PCB 130 as described in FIGS. 3A and 3B. In some implementations, for example, the coaxial PCB 130 can be the coaxial PCB 130, as described in FIGS. 3C and 3D. In some implementations, for example, the coaxial PCB 130 can be the coaxial PCB 130, as described in FIG. 3E. While FIG. 4A illustrates the positioning of the toroid 132 and the coaxial PCB 130, in some implementations, the positioning of the toroid 132 and the coaxial PCB 130 can be reversed.

Figure 4B:
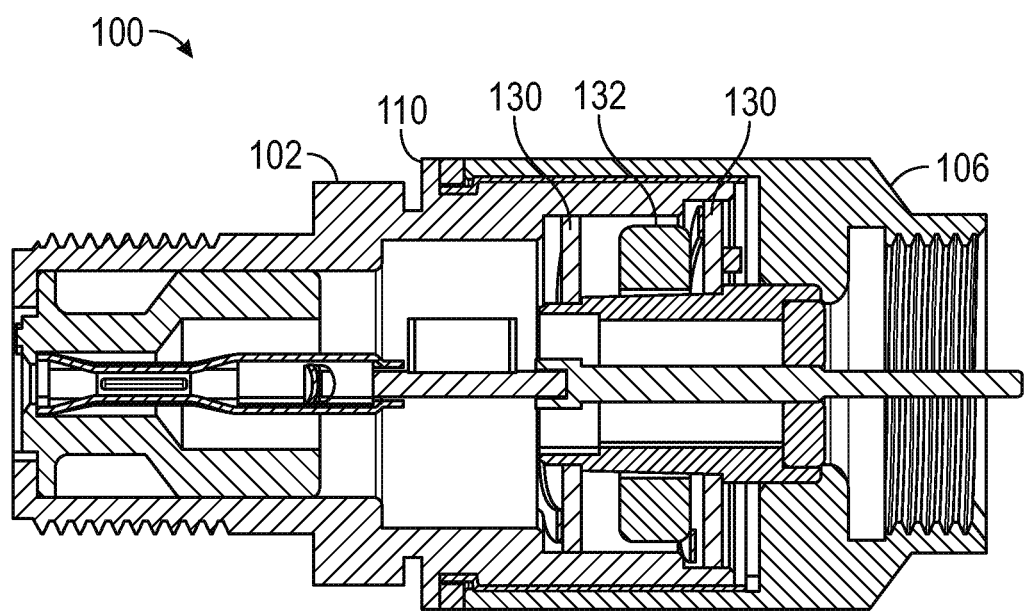
FIG. 4B illustrates a cutaway side view of an example of an isolator, according to various implementations consistent with the present disclosure.

FIG. 4B illustrates a cutaway side view of an example of the isolator 100, according to another implementation. As shown, the isolator 100 can be configured with the toroid 132 placed between the two coaxial PCBs 130. In some implementations, for example the isolator 100 can include two versions of the coaxial PCB 130. In some implementations, for example, the isolator 100 can include two of the coaxial PCBs 130, illustrated in FIGS. 3A and 3B. In some implementations, for example, the isolator 100 can include two of the coaxial PCBs 130, illustrated in FIGS. 3C and 3D. In some implementations, for example, the isolator 100 can include two of the coaxial PCB 130, as described in FIG. 3E. In some implementations, for example, the isolator 100 can include one of the coaxial PCB 130, illustrated in FIGS. 3A and 3B, and one of the coaxial PCB 130 as described in FIGS. 3C and 3D. In some implementations, for example, the isolator 100 can include one of the coaxial PCB 130, as described in FIG. 3E. In some implementations, for example, the two coaxial PCBs 130 can include the same SMT circuits, different SMT circuits, or combinations thereof.

Figure 4C:
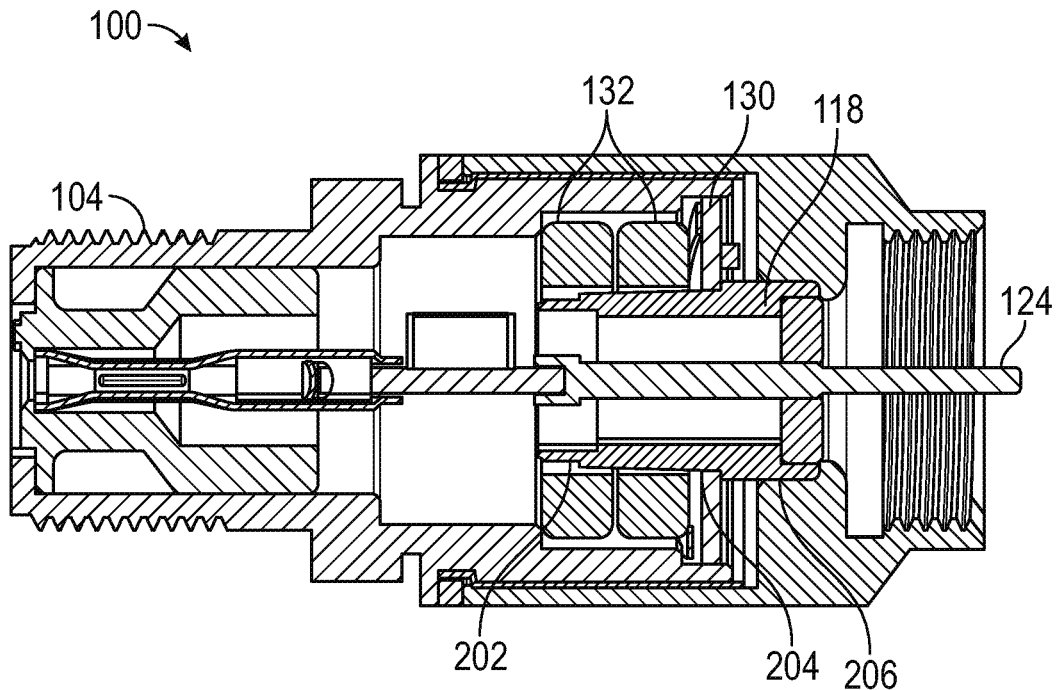
FIG. 4C illustrates a cutaway side view of an example of an isolator, according to various implementations consistent with the present disclosure.

FIG. 4C illustrates a cutaway side view of an example of the isolator 100 according to various implementations. As shown, the isolator 100 can be configured with the two toroids 132. In this example, the toroids 132 can be positioned can be positioned on a side of the isolator 100 closer to the coupler 104. For example, the toroids 132 can be formed to fit over the diameters 202 and 204 of the coupling/filtering member 118. The isolator 100 can also include the coaxial PCB 130 positioned on the output side of the coupling/filtering member 118. In some implementations, for example, the coaxial PCB 130 can be the coaxial PCB 130 as described in FIGS. 3A and 3B. In some implementations, for example, the coaxial PCB 130 can be the coaxial PCB 130, as described in FIGS. 3C and 3D. In some implementations, for example, the coaxial PCB 130 can be the coaxial PCB 130, as described in FIG. 3E. While FIG. 4C illustrates the positioning of the toroids 132 and the coaxial PCB 130, in some implementations, the positioning of the toroids 132 and the coaxial PCB 130 can be reversed.

Figure 4D:
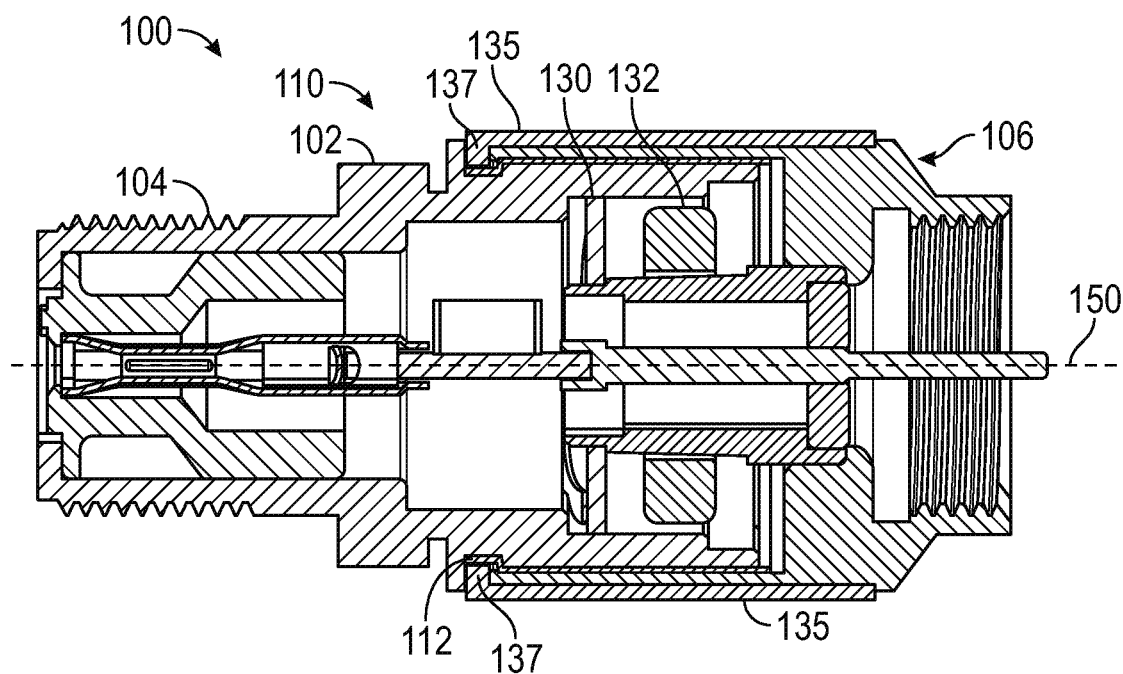
FIG. 4D illustrates a cutaway side view of an example of an isolator, according to various implementations consistent with the present disclosure.

FIG. 4D illustrates a cutaway side view of an example of the isolator 100, according to various implementations. The components in the implementation of the isolator shown in FIG. 4D can be the same or similar to those previously described herein. As shown, the isolator 100 can be configured with the toroid 132 positioned after the coaxial PCB 130 with respect to the position of the coupler 104 of the body 102 around the central axis 150 of the isolator 100. In some implementations, for example, the coaxial PCB 130 can be the coaxial PCB 130 as described in FIGS. 3A and 3B. In some implementations, for example, the coaxial PCB 130 can be the coaxial PCB 130, as described in FIGS. 3C and 3D. In some implementations, for example, the coaxial PCB 130 can be the coaxial PCB 130, as described in FIG. 3E. While FIG. 4A illustrates the positioning of the toroid 132 and the coaxial PCB 130, in some implementations, the positioning of the toroid 132 and the coaxial PCB 130 can be reversed.

In some implementations, the isolator 100 can include the insulator sleeve 135. As illustrated in FIG. 4D, the insulator sleeve 135 can be placed over a portion of the outer shield 106. The insulator sleeve 135 can create an insulating barrier or grip on the outside of the isolator 100 so that the isolator 100 can be safely handled by an installer or user. When the shield 106 is compression fitted over the body 102, lip 137 of the insulator sleeve 135 can fit between the lip 110 of the body 102 and the edge 112 of the outer shield 106.

Figure 4E:
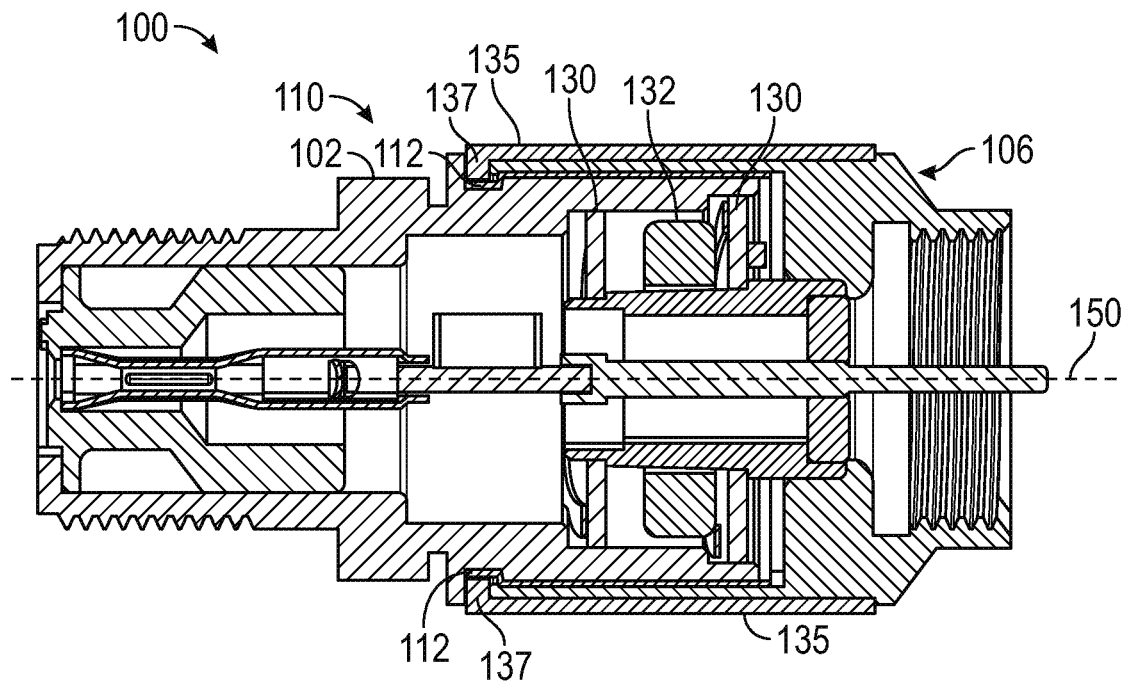
FIG. 4E illustrates a cutaway side view of an example of an isolator, according to various implementations consistent with the present disclosure.

FIG. 4E illustrates a cutaway side view of an example of the isolator 100, according to various implementations. The components in the implementation of the isolator shown in FIG. 4E can be the same or similar to those previously described herein. As shown, the isolator 100 can be configured with the toroid 132 positioned between the two coaxial PCBs 130 around the central axis 150 of the isolator 100. In some implementations, for example the isolator 100 can include two versions of the coaxial PCB 130. In some implementations, for example, the isolator 100 can include two of the coaxial PCBs 130, illustrated in FIGS. 3A and 3B. In some implementations, for example, the isolator 100 can include two of the coaxial PCBs 130, illustrated in FIGS. 3C and 3D. In some implementations, for example, the isolator 100 can include two of the coaxial PCB 130, as described in FIG. 3E. In some implementations, for example, the isolator 100 can include one of the coaxial PCB 130, illustrated in FIGS. 3A and 3B, and one of the coaxial PCB 130 as described in FIGS. 3C and 3D. In some implementations, for example, the isolator 100 can include one of the coaxial PCB 130, as described in FIG. 3E. In some implementations, for example, the two coaxial PCBs 130 can include the same SMT circuits, different SMT circuits, or combinations thereof.

In some implementations, the isolator 100 can include the insulator sleeve 135. As illustrated in FIG. 4E, the insulator sleeve 135 can be placed over a portion of the outer shield 106. The insulator sleeve 135 can create an insulating barrier or grip on the outside of the isolator 100 so that the isolator 100 can be safely handled by an installer or user. When the shield 106 is compression fitted over the body 102, the lip 137 of the insulator sleeve 135 can fit between the lip 110 of the body 102 and the edge 112 of the outer shield 106.

Figure 4F:
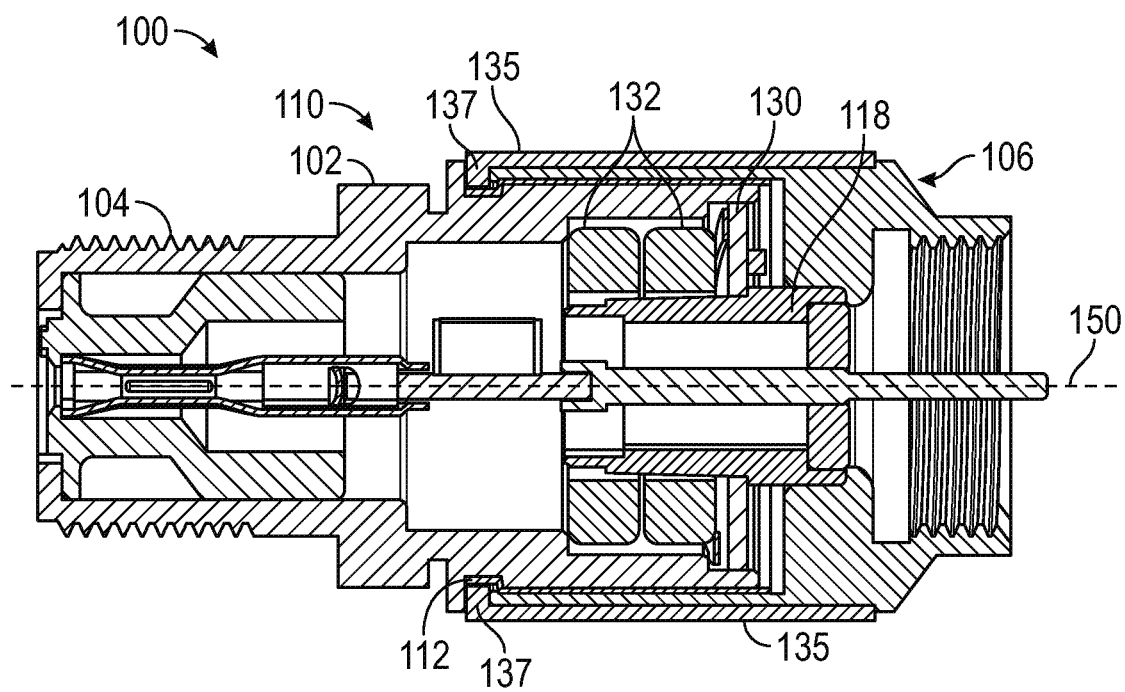
FIG. 4F illustrates a cutaway side view of an example of an isolator, according to various implementations consistent with the present disclosure.

FIG. 4F illustrates a cutaway side view of an example of the isolator 100 according to various implementations. The components in the implementation of the isolator shown in FIG. 4F can be the same or similar to those previously described herein. As shown, the isolator 100 can be configured with at least one PCB 130 the two toroids 132. In this implementation, the toroids 132 can be positioned can be positioned around the central axis 150 on a side of the isolator 100 closer to the coupler 104 in relation to the PCB 130. For example, the toroids 132 can be formed to fit over the diameters 202 and 204 of the coupling/filtering member 118. The isolator 100 can also include the coaxial PCB 130 positioned on the output side of the coupling/filtering member 118. In some implementations, for example, the coaxial PCB 130 can be the coaxial PCB 130 as described in FIGS. 3A and 3B. In some implementations, for example, the coaxial PCB 130 can be the coaxial PCB 130, as described in FIGS. 3C and 3D. In some implementations, for example, the coaxial PCB 130 can be the coaxial PCB 130, as described in FIG. 3E. While FIG. 4F illustrates the positioning of the toroids 132 and the coaxial PCB 130, in some implementations, the positioning of the toroids 132 and the coaxial PCB 130 can be reversed.

In some implementations, the isolator 100 can include the insulator sleeve 135. As illustrated in FIG. 4F, the insulator sleeve 135 can be placed over a portion of the outer shield 106. The insulator sleeve 135 can create an insulating barrier or grip on the outside of the isolator 100 so that the isolator 100 can be safely handled by an installer or user. When the shield 106 is compression fitted over the body 102, the lip 137 of the insulator sleeve 135 can fit between the lip 110 of the body 102 and the edge 112 of the outer shield 106.

Figure 4G:
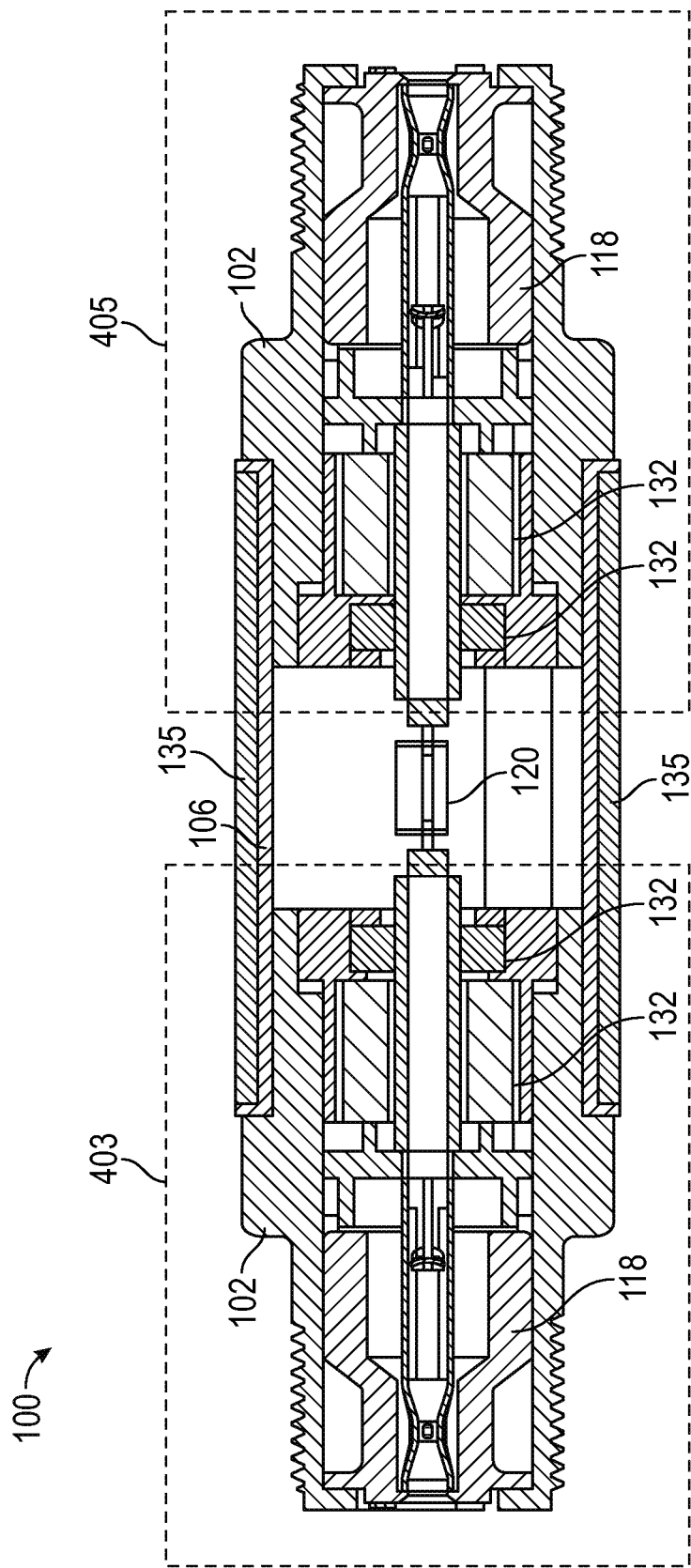
FIG. 4G illustrates a cutaway side view of an example of an isolator, according to various implementations consistent with the present disclosure.

FIG. 4G illustrates a cutaway side view of an example of the isolator 100 according to various implementations. The components in the implementation of the isolator shown in FIG. 4G can be the same or similar to those previously described herein. As shown, the isolator 100 can be configured to include a symmetrical input side 403 and output side 405. For example, as illustrated, the isolator 100 can include two the female (or male) input sides with the PCB 120 coupled between. In this example, each side 403, 405 can include a body 102, and coupling/filtering member 118. The body 102 of each side 403, 405 can compress a common insulator sleeve 135 between the body 102 of each side 403, 405. Additionally, each side 403, 405 can include one or more coaxial PCBs 130 and one or more toroids 132. For example, each side of the isolator 100 can include a configuration of one or more coaxial PCB 130 and one or more toroids 132 as described above in FIGS. 4A-4F or as described below in FIGS. 4H and 4I.

Figure 4H:
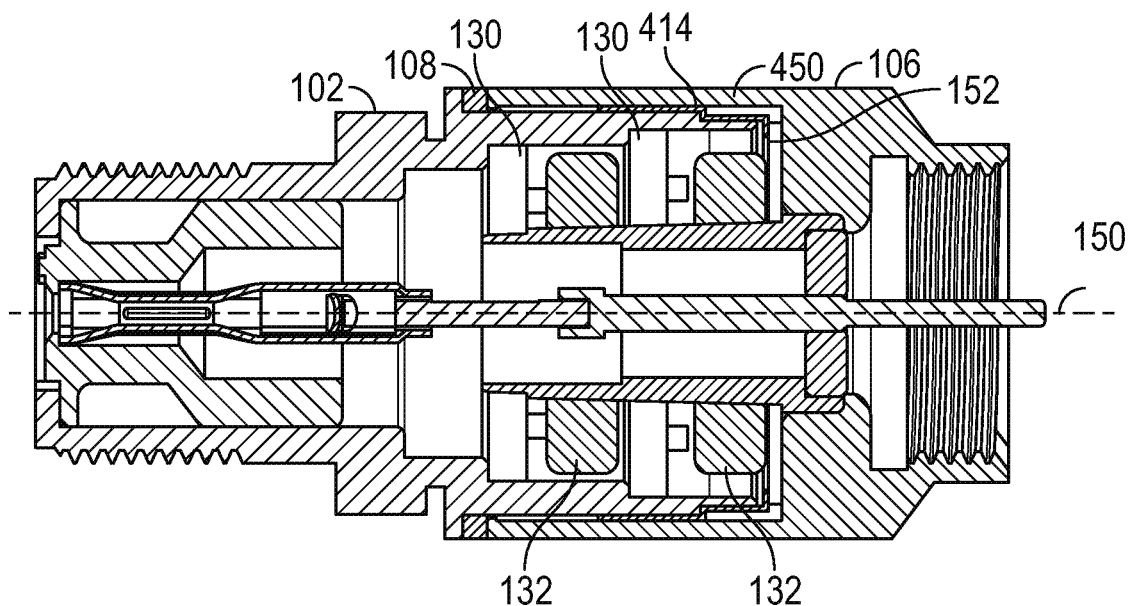
FIG. 4H illustrates a cutaway side view of an example of an isolator, according to various implementations consistent with the present disclosure.

FIG. 4H illustrates a cutaway side view of an example of the isolator 100 according to various implementations. The components in the implementation of the isolator shown in FIG. 4H can be the same or similar to those previously described herein. As shown, the isolator 100 can include two coaxial PCBs 130 and two toroids 132. As discussed above with reference to FIG. 1E, the two coaxial PCBs 130 and toroids 132 can be positioned around the central axis 150 in an alternating pattern. In some implementations, the isolator 100 can include two of the coaxial PCBs 130, illustrated in FIGS. 3A and 3B. In some implementations, for example, the isolator 100 can include two of the coaxial PCBs 130, illustrated in FIGS. 3C and 3D. In some implementations, for example, the isolator 100 can include two of the coaxial PCB 130, as described in FIG. 3E. In some implementations, for example, the isolator 100 can include one of the coaxial PCB 130, illustrated in FIGS. 3A and 3B, and one of the coaxial PCB 130 as described in FIGS. 3C and 3D. In some implementations, for example, the isolator 100 can include one of the coaxial PCB 130, as described in FIG. 3E. In some implementations, for example, the two coaxial PCBs 130 can include the same circuits, different circuits, or combinations thereof.

In some implementations, as illustrated in FIG. 4H, the isolator 100 can include the sleeve 414 that includes a tapered portion 450. The sleeve can be formed from a dielectric material, as previously described herein. The tapered portion 450 can be formed to a diameter smaller than the remaining portion of the sleeve 414. The tapered portion 450 can be configured to engage with a tapered portion 152 of the body 102 when the isolator 100 is assembled by compression fitting. The sleeve 414 can be placed between the outer shield 106 and the body 102. The spacer 108 and the sleeve 414 can, thereby, create an electrical barrier between the body 102 and the outer shield 106 that electrically isolates the body 102 for the outer shield 106 when the shield is compression fitted on the body 102.

Figure 4I:
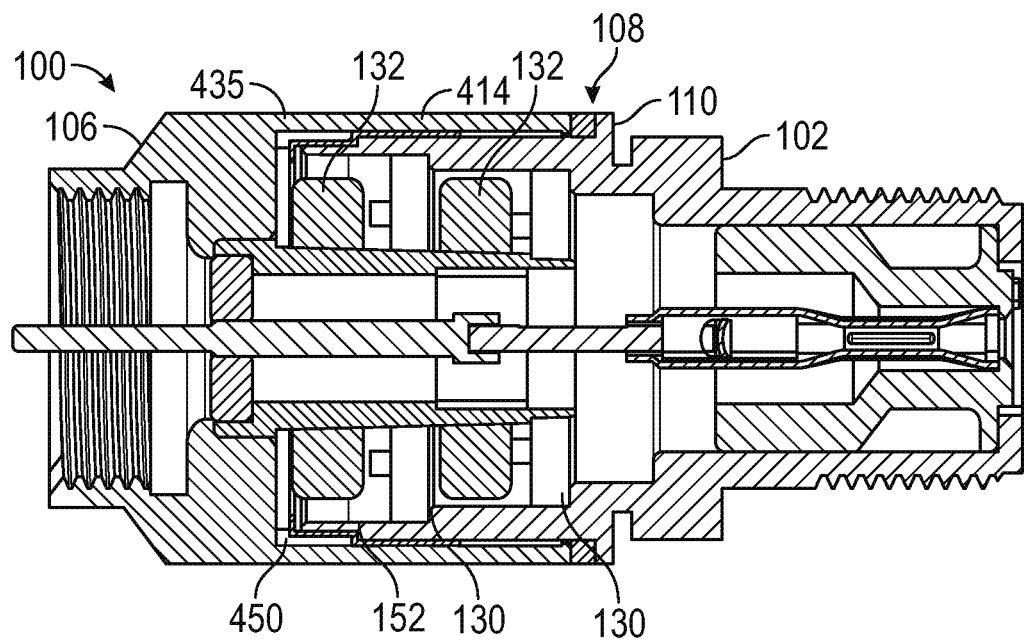
FIG. 4I illustrates a cutaway side view of an example of an isolator, according to various implementations consistent with the present disclosure.

FIG. 4I illustrates a cutaway side view of an example of the isolator 100 according to various implementations. The components in the implementation of the isolator shown in FIG. 4I can be the same or similar to those previously described herein. As shown, the isolator 100 can include two coaxial PCBs 130 and two toroids 132. As discussed above with reference to FIG. 1E, the two coaxial PCBs 130 and toroids 132 can be positioned around the central axis 150 in an alternating pattern. In some implementations, for example, the isolator 100 can include two of the coaxial PCBs 130, illustrated in FIGS. 3A and 3B. In some implementations, for example, the isolator 100 can include two of the coaxial PCBs 130, illustrated in FIGS. 3C and 3D. In some implementations, for example, the isolator 100 can include two of the coaxial PCB 130, as described in FIG. 3E. In some implementations, for example, the isolator 100 can include one of the coaxial PCB 130, illustrated in FIGS. 3A and 3B, and one of the coaxial PCB 130 as described in FIGS. 3C and 3D. In some implementations, for example, the isolator 100 can include one of the coaxial PCB 130, as described in FIG. 3E. In some implementations, for example, the two coaxial PCBs 130 can include the same circuits, different circuits, or combinations thereof.

In some implementations, as illustrated in FIG. 4I, the isolator 100 can include sleeve 414 that includes a tapered portion 450. As described previously, the tapered portion 450 can be formed to a diameter smaller than the remaining portion of the sleeve 414. The tapered portion 450 can be configured to engage with a tapered portion 152 of the body 102 when the isolator 100 is compression fitted. The sleeve 114 can be placed between the outer shield 106 and the body 102 to create an electrical barrier between the body 102 and the outer shield 106 as previously described herein.

In some implementations, as illustrated in FIG. 4I, the isolator 100 can also include a one or more gaskets 455. The gasket 455 can be formed in a cylindrical configuration around the central axis 150 and fit between the body 102 and the outer shield 106 and surround the filtering/coupling member 118. In some example, the gasket 455 can be formed of a non-conductive material, a conductive material, or combinations thereof. The gasket 455 can be positioned to improve performance of the shielding effectiveness, for example, shielding radio frequency interference. While FIG. 4I illustrates one position for the gasket 455, the one or more gaskets 455 can be positioned at any location in the isolator 100 to improve performance of the shielding effectiveness, for example, shielding radio frequency interference. Additionally, any of the examples illustrated above in FIGS. 4A-4H can include one or more gaskets 455.

Figure 5:
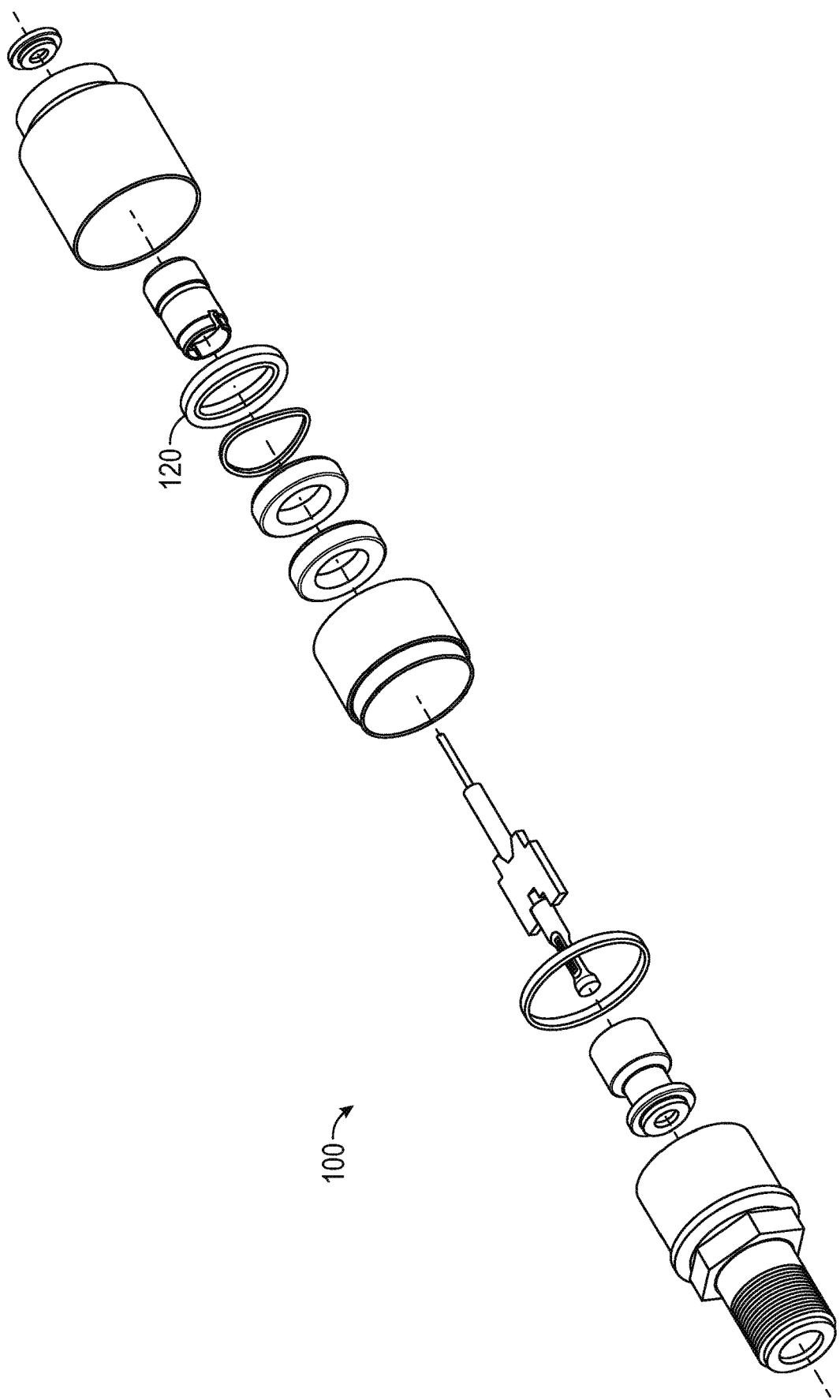
FIG. 5 illustrates an exploded perspective of an example of an isolator, according to various implementations consistent with the present disclosure.

FIG. 5 illustrates an exploded perspective of an example of an isolator 100, according to various implementations consistent with the present disclosure. The various components of the isolator 100 illustrated in the examples shown in FIG. 5 can be the same or similar to those previously described herein. As illustrated in FIG. 5, the isolator 100 can include a PCB 120 that provides signal conditioning for a Multimedia over Coax Alliance (MoCA) signals. For example, the PCB 120 can include a one or more RF filters where a passband is 5 MHz-1002 MHz and a reject band is 1125 MHz to 1675 MHz ii). For example, the PCB 120 can include a one or more filters where a passband is 5 MHz-1194 MHz and a reject band is 1218 MHz to 1675 MHz. While not illustrated in FIG. 5, the example of the isolator 100 illustrated in FIG. 5 can include an insulator sleeve 135 as described above.

While the teachings have been described with reference to examples of the implementations thereof, those skilled in the art will be able to make various modifications to the described implementations without departing from the true spirit and scope. The terms and descriptions used herein are set forth by way of illustration only and are not meant as limitations. In particular, although the method has been described by examples, the steps of the method may be performed in a different order than illustrated or simultaneously. Furthermore, to the extent that the terms "including", "includes", "having", "has", "with", or variants thereof are used in either the detailed description and the claims, such terms are intended to be inclusive in a manner similar to the term "comprising." As used herein, the terms "one or more of" and "at least one of" with respect to a listing of items such as, for example, A and B, means A alone, B alone, or A and B. Further, unless specified otherwise, the term "set" should be interpreted as "one or more." Also, the term "couple" or "couples" is intended to mean either an indirect or direct connection. Thus, if a first device couples to a second device, that connection may be through a direct connection, or through an indirect connection via other devices, components, and connections.

What is claimed is:

1. A coaxial radio frequency (RF) isolator comprising:
a conductive body comprising a first coaxial coupler configured to connect the isolator to a first device;
a conductive outer shield positioned at least partially around at least a portion of the conductive body;
a dielectric barrier positioned at least partially between conductive body and the conductive outer shield, wherein the dielectric barrier is configured to electrically isolate the conductive body from the conductive outer shield;
a second coaxial coupler configured to connect the isolator to a second device;
a signal conditioning device configured to condition RF signals communicated between the first coaxial coupler and the second coaxial coupler;
a signal path extending at least partially through the first coaxial coupler, the signal conditioning device, and the second coaxial coupler, wherein the signal path is configured to conduct the RF signals between the first coaxial coupler and the second coaxial coupler;
a coaxial circuit configured to block direct current flow between the conductive body, the conductive outer shield, the second coaxial coupler, or a combination thereof; and
a magnetic toroid configured to filter the RF signals from electromagnetic interference.

2. The isolator of claim 1, wherein the conductive outer shield is configured to slide over the conductive body and to attach to the conductive body solely by compression fitting.

3. The isolator of claim 1, wherein the coaxial circuit is configured to attach at least partially within the isolator solely by compression fitting.

4. The isolator of claim 1, wherein:
the coaxial circuit comprises an annular shape;
a first surface of the coaxial circuit is configured to contact the conductive body;
a second surface of the coaxial circuit is configured to contact the signal conditioning device; and
a third surface of the coaxial surface is configured to contact the second coaxial coupler.

5. The isolator of claim 1, wherein the coaxial circuit comprises:
an insulator ring;
a first conductor layer formed on an outer surface of the insulator ring;
a second conductor layer formed on an inner surface of the insulator ring; and
one or more electrical circuits configured to electrically couple the first conductor layer and the second conductor layer.

6. The isolator of claim 1, wherein the magnetic toroid comprises an inner diameter configured to fit around an outer diameter of the second coaxial coupler.

7. The isolator of claim 1, further comprising a dielectric spacer comprising an annular shape, wherein the dielectric spacer is configured to electrically isolate the conductive body from the conductive outer shield.

8. The isolator of claim 1, wherein the dielectric barrier comprises a cylindrical shape configured to fit over an outer surface of the conductive outer shield to provide an insulating grip.

9. An isolator comprising:
an input connector configured to connect the isolator to a first device;
an output connector configured to connect the isolator to a second device;
a body comprising an outer shield;
a coupling member positioned at least partially within the outer shield, wherein the coupling member is configured to electrically couple with the outer shield;
a coaxial circuit positioned at least partially around a first portion of the coupling member;

a toroid positioned at least partially around a second portion of the coupling member;
a compression material configured to apply a force to the coaxial circuit and the toroid; and
a signal conditioning circuit configured to condition signals communicated between the input connector and the output connector.

10. The isolator of claim 9, further comprising one or more dielectric members configured to electrically isolate the outer shield.

11. The isolator of claim 9, wherein the coaxial circuit is configured to electrically couple the coupling member with the body.

12. The isolator of claim 9, wherein the signal conditioning circuit comprises a component selected from the group consisting of: a high pass filter, a low pass filter, an amplifier, a bandpass filter, a band reject filter, and a Multimedia over Coax Alliance (MoCA) circuit.

13. The isolator of claim 12, further comprising a second coaxial circuit positioned at least partially around a third portion of the coupling member.

14. The isolator of claim 12, further comprising a second toroid positioned at least partially around a third portion of the coupling member.

15. An isolator comprising:
an outer shield;
a first connector configured to connect the isolator to a first device;
a second connector configured to connect the isolator to a second device;
a conditioning circuit configured to condition signals communicated between the first connector and the second connector;
an anti-rotation feature configured to prevent the conditioning circuit from rotating; and
a coaxial circuit configured to provide ground isolation between the first connector and the second connector.

16. The isolator of claim 15, further comprising a toroid positioned at least partially around the second connector, wherein the toroid is configured to filter electromagnetic interference.

17. The isolator of claim 15, further comprising a signal path extending at least partially through the first connector, the conditioning circuit, and the second connector, wherein the signal path is configured to conduct the signals communicated between the first connector and the second connector.

18. The isolator of claim 17, wherein the coaxial circuit is positioned at least partially around the signal path.

19. The isolator of claim 15, wherein the coaxial circuit is configured to block direct current flow between the outer shield and the second connector.

20. The isolator of claim 15, wherein:
the first connector is configured to receive an input signal from the first device; and
the second connector is configured to transmit an output signal to the second device.

21. The isolator of claim 15, further comprising a compression material configured to apply a force to the coaxial circuit.

22. The isolator of claim 15, wherein the anti-rotation feature comprises a coupling member having a slot formed therein.

23. The isolator of claim 22, further comprising a toroid configured to filter electromagnetic interference, wherein the coaxial circuit is configured to be positioned at least partially around a first portion of the coupling member, and wherein the toroid is configured to be positioned at least partially around a second portion of the coupling member.

24. The isolator of claim 22, wherein the conditioning circuit is configured to be positioned at least partially within the slot, thereby preventing the conditioning circuit from rotating.

25. The isolator of claim 24, wherein the slot is defined at least partially by:
a first axially extending surface;
a second axially extending surface that is circumferentially offset from the first axially extending surface; and
a circumferentially extending surface that extends between the first and second axially extending surfaces.

26. The isolator of claim 24, wherein the slot extends from an inner radial surface of the coupling member to an outer radial surface of the coupling member.

27. The isolator of claim 24, wherein the slot comprises two slots that are circumferentially offset from one another around an axial end of the coupling member.

28. An isolator comprising:
an input connector configured to connect the isolator to a first device;
an output connector configured to connect the isolator to a second device;
a signal conditioning circuit configured to be positioned at least partially between the input connector and the output connector and to condition signals communicated between the input connector and the output connector;
a coupling member configured to be positioned at least partially between the input connector and the output connector, wherein the coupling member comprises an anti-rotation feature that is configured to prevent the signal conditioning circuit from rotating;
a coaxial circuit configured to be positioned at least partially around a first portion of the coupling member;
a toroid configured to be positioned at least partially around a second portion of the coupling member; and
an outer shield configured to be positioned at least partially around the coupling member, the coaxial circuit, and the toroid.

29. The isolator of claim 28, further comprising a compression material configured to apply a force to the coaxial circuit, the toroid, or both.

30. The isolator of claim 28, wherein the anti-rotation feature comprises a slot that is defined at least partially by:
a first axially extending surface;
a second axially extending surface that is circumferentially offset from the first axially extending surface; and
a circumferentially extending surface that extends between the first and second axially extending surfaces.

31. The isolator of claim 28, wherein the anti-rotation feature extends from an inner radial surface of the coupling member to an outer radial surface of the coupling member.

32. The isolator of claim 28, wherein the anti-rotation feature comprises two anti-rotation features that are circumferentially offset from one another around an axial end of the coupling member.

33. An isolator comprising:
a first connector configured to connect the isolator to a first device;
a second connector configured to connect the isolator to a second device;
a conditioning circuit configured to condition signals communicated between the first connector and the second connector;

an outer shield configured to be positioned at least partially around the conditioning circuit;

an anti-rotation feature configured to prevent the conditioning circuit from rotating with respect to the outer shield; and a coaxial circuit configured to be positioned at least partially within the outer shield.

34. The isolator of claim 33, wherein the anti-rotation feature comprises a coupling member, and wherein the coaxial circuit is positioned at least partially around the coupling member.

35. The isolator of claim 34, wherein the coupling member defines a slot therein, and wherein the conditioning circuit is configured to be positioned at least partially within the slot, thereby preventing the conditioning circuit from rotating.

36. The isolator of claim 35, wherein the slot is defined at least partially by:

a first axially extending surface;

a second axially extending surface that is circumferentially offset from the first axially extending surface; and a circumferentially extending surface that extends between the first and second axially extending surfaces.

37. The isolator of claim 34, wherein the anti-rotation feature extends from an inner radial surface of the coupling member to an outer radial surface of the coupling member.

38. The isolator of claim 34, wherein the anti-rotation feature comprises two anti-rotation features that are circumferentially offset from one another around an axial end of the coupling member.

* * * * *